(12) United States Patent
Schauer et al.

(10) Patent No.: US 6,763,281 B2
(45) Date of Patent: Jul. 13, 2004

(54) APPARATUS FOR ALIGNMENT OF AUTOMATED WORKPIECE HANDLING SYSTEMS

(75) Inventors: Ronald Vern Schauer, Gilroy, CA (US); Alan Rick Lappen, San Martin, CA (US)

(73) Assignee: Applied Materials, Inc, Santa Clara, CA (US)

(*) Notice: Subject to any disclaimer, the term of this patent is extended or adjusted under 35 U.S.C. 154(b) by 133 days.

(21) Appl. No.: 09/881,854

(22) Filed: Jun. 13, 2001

(65) Prior Publication Data

US 2002/0021959 A1 Feb. 21, 2002

Related U.S. Application Data

(63) Continuation-in-part of application No. 09/294,301, filed on Apr. 19, 1999.

(51) Int. Cl.⁷ .................................................. G06F 7/00
(52) U.S. Cl. .................. 700/218; 414/222.02; 414/937; 206/710
(58) Field of Search ................................. 700/213, 214, 700/218; 414/217, 222.01, 222.02, 222.13, 226.05, 935, 936, 937, 938, 939, 940; 206/454, 711, 710; 356/400

(56) References Cited

U.S. PATENT DOCUMENTS

| | | |
|---|---|---|
| 3,877,134 A | 4/1975 | Shanahan |
| 3,934,733 A | 1/1976 | Worden |
| 4,176,751 A | 12/1979 | Gillissie |
| 4,178,113 A | 12/1979 | Beaver, II et al. |
| 4,493,418 A | 1/1985 | Johnson |
| 4,687,097 A | 8/1987 | Mortensen |
| 4,759,681 A | 7/1988 | Nogami |
| 4,770,590 A | 9/1988 | Hugues et al. |

(List continued on next page.)

FOREIGN PATENT DOCUMENTS

| | | |
|---|---|---|
| EP | 0425184 | 5/1994 |
| EP | 1047115 | 10/2000 |
| JP | 1028933 | 1/1989 |
| JP | 3156624 | 7/1991 |
| JP | 5013551 | 1/1993 |
| JP | 6131032 | 5/1994 |
| JP | 9162257 | 6/1997 |
| JP | 9199571 | 7/1997 |
| JP | 10 154738 | 7/2000 |
| WO | 9858402 | 12/1998 |

OTHER PUBLICATIONS

AMAT Manual, Chapter 3, "Wafer Handler;" section 3.1, "Robot Setup and Calibration." AMAT doc ID 042–021–03, pp. 3–33 to 3–42; predating filling date of present application by at least one year.

(List continued on next page.)

*Primary Examiner*—Khoi H. Tran
(74) *Attorney, Agent, or Firm*—Konrad Raynes Victor & Mann, LLP; Joseph Bach

(57) ABSTRACT

An alignment tool, method and system are provided for aligning a robot blade in a workpiece handling system, in which the tool comprises a frame or fixture adapted to be supported by a transfer chamber support surface or other support surface in the system, in which the frame has one or more non-contact distance sensors positioned to measure the distance of a workpiece or robot blade from the sensor or a predetermined reference point or surface. In one embodiment, the frame is used to align a robot blade relative to a robot support alignment surface in a robot chamber. In another embodiment, the frame emulates a workpiece cassette and the distance sensors provide an output to align the robot blade to a cassette support alignment surface. As a consequence, accidental scratching and breakage of workpieces such as semiconductor wafers and display substrates may be reduced or eliminated. In another embodiment, positions of distance sensors may be readily repositioned to accommodate alignment procedures for different sized wafers or other workpieces.

37 Claims, 25 Drawing Sheets

U.S. PATENT DOCUMENTS

| | | | |
|---|---|---|---|
| 4,819,167 A | * 4/1989 | Cheng et al. | .................. 700/59 |
| 4,836,733 A | 6/1989 | Hertel et al. | |
| 4,951,601 A | 8/1990 | Maydan et al. | |
| 4,952,299 A | 8/1990 | Chrisos et al. | |
| 4,955,780 A | 9/1990 | Shimane et al. | |
| 5,042,671 A | 8/1991 | Bischoff et al. | |
| 5,111,936 A | 5/1992 | Kos | |
| 5,149,244 A | 9/1992 | Webber et al. | |
| 5,186,594 A | 2/1993 | Toshima et al. | |
| 5,186,718 A | 2/1993 | Tepman et al. | |
| 5,217,341 A | 6/1993 | Webber et al. | |
| 5,225,691 A | * 7/1993 | Powers et al. | ........... 250/559.4 |
| 5,227,708 A | 7/1993 | Lowrance | |
| 5,292,393 A | 3/1994 | Maydan et al. | |
| 5,387,067 A | 2/1995 | Grunes | |
| 5,418,382 A | * 5/1995 | Blackwood et al. | ... 250/559.36 |
| 5,436,721 A | 7/1995 | Pence et al. | |
| 5,438,418 A | * 8/1995 | Fukui et al. | ................ 356/399 |
| 5,443,346 A | 8/1995 | Murata et al. | |
| 5,447,409 A | 9/1995 | Grunes et al. | |
| 5,452,521 A | 9/1995 | Niewmierzycki | |
| 5,454,170 A | 10/1995 | Cook | |
| 5,483,138 A | 1/1996 | Shmookler et al. | |
| D368,802 S | 4/1996 | Gallagher et al. | |
| 5,510,892 A | 4/1996 | Mizutani et al. | |
| 5,516,732 A | 5/1996 | Flegal | |
| 5,525,024 A | 6/1996 | Freerks et al. | |
| 5,530,550 A | 6/1996 | Nikoonahad et al. | |
| 5,556,248 A | 9/1996 | Grunes | |
| 5,563,798 A | 10/1996 | Berken et al. | |
| 5,570,994 A | 11/1996 | Somekh et al. | |
| 5,604,443 A | 2/1997 | Kitamura et al. | |
| 5,605,428 A | 2/1997 | Birkner et al. | |
| 5,610,102 A | 3/1997 | Gardopee et al. | |
| 5,611,655 A | 3/1997 | Fukasawa et al. | |
| 5,615,988 A | 4/1997 | Wiesler et al. | |
| 5,636,960 A | * 6/1997 | Hiroki et al. | ................ 414/781 |
| 5,644,400 A | 7/1997 | Mundt | |
| 5,655,277 A | 8/1997 | Galdos et al. | |
| 5,706,201 A | 1/1998 | Andrews | |
| 5,713,711 A | 2/1998 | McKenna et al. | |
| 5,740,059 A | 4/1998 | Hirata et al. | |
| 5,769,588 A | 6/1998 | Toshima et al. | |
| 5,783,834 A | * 7/1998 | Shatas | .................... 250/559.33 |
| 5,785,186 A | 7/1998 | Babbs et al. | |
| 5,905,302 A | * 5/1999 | Lane et al. | .................. 257/678 |
| 5,980,188 A | 11/1999 | Ko et al. | |
| 5,980,194 A | 11/1999 | Freerks et al. | |
| 6,010,009 A | 1/2000 | Peterson et al. | |
| 6,019,563 A | * 2/2000 | Murata et al. | ......... 414/222.01 |
| 6,036,031 A | 3/2000 | Ishikawa | |
| 6,039,186 A | 3/2000 | Bhatt et al. | |
| 6,047,480 A | 4/2000 | Powers | |
| 6,060,721 A | * 5/2000 | Huang | ..................... 250/559.4 |
| 6,063,196 A | 5/2000 | Li et al. | |
| 6,082,950 A | 7/2000 | Altwood et al. | |
| 6,085,125 A | 7/2000 | Genov | |
| 6,095,335 A | 8/2000 | Busby | |
| 6,126,380 A | 10/2000 | Hillman | |
| 6,178,361 B1 | 1/2001 | George et al. | |
| 6,197,117 B1 | 3/2001 | Li et al. | |
| 6,286,688 B1 | * 9/2001 | Mimken et al. | ......... 211/41.18 |
| 6,298,280 B1 | 10/2001 | Bonora et al. | |
| 6,300,644 B1 | * 10/2001 | Beckhart et al. | ....... 250/559.33 |
| 6,307,211 B1 | 10/2001 | Beckhart et al. | |
| 6,388,436 B1 | * 5/2002 | Nodot et al. | ............. 324/158.1 |
| 6,390,753 B1 | * 5/2002 | De Ridder | .................. 414/160 |
| 6,390,754 B2 | * 5/2002 | Yamaga et al. | ............. 414/217 |
| 6,401,554 B1 | * 6/2002 | Mori et al. | ................ 73/865.9 |

OTHER PUBLICATIONS

AMAT Manual, Chapter 3, "Wafer Handler;" section 3.2, "Loadlock Cassette and Indexer Setup and Calibration." AMAT doc ID 042–021–03, pp 3–42 to 3–54;predating filing date of present application by at least one year.

AMAT Manual, Chapter 3, "Wafer Handler;" section 3.3 through 3.6, "Wafer Handoff Calibration." AMAT doc ID 256–024–03, pp 3–54 to 3–73; predating filing date of present application by at least one year.

AMAT Manual, Chapter 7, "Wafer Handler and Wafer Handoff Setup and Calibrations;" (all). AMAT doc ID 256–024–03, pp 7–1 to 7–17; predating filing date of present application by at least one year.

AMAT Manual, Chapter 7, "Wafer Handler Setup and Calibration;" section 7.1 through 7.9. AMAT doc ID 142–351–02, pp 7–1 to 7–18; predating filing date of present application by at least one year.

AMAT Manual, Chapter 7, "Wafer Mapping;" section 7.10, "Wafer Mapping." AMAT doc ID 142–351–02, pp 7–19 to 7–26; predating filing date of present application by at least one year.

Declaration of A. Lappen, 13JL2001.
Declaration of E. Ruhland, 02DE2002.
Declaration of R. Schauer, 20JL2000.
Declaration of R. Schauer, 18NO2002.
Declaration of R. Schauer, 29MY2003.
Iscoff, Ron. "Dry Etching Systems: Gearing up for Larger Wafers," Semiconductor International, Oct. 1985, pp 48—60.
US 10/303,516 filed Nov. 25, 2002 (146 pp).
US 10/266,389 filed Oct. 8, 2002, (109 pp).
PCT/US02/18494 Search Report dated May 7, 2003.

* cited by examiner

| | | |
|---|---|---|
| BLUE | 0.000 in | ΔL/R 0.000 in |
| YELLOW | 0.000 in | ΔF/B 0.000 in |
| RED | 0.000 in | |
| ZERO | | |

— 530

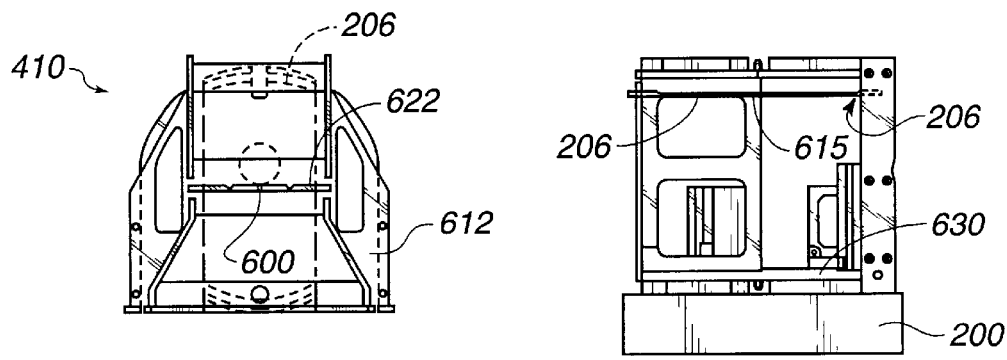
*Fig. 11*
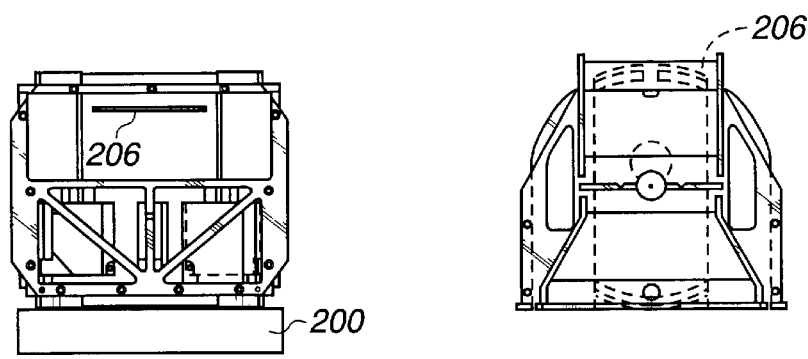
*Fig. 12a*  *Fig. 12b*
*Fig. 12c*  *Fig. 12d*

US 6,763,281 B2

APPARATUS FOR ALIGNMENT OF AUTOMATED WORKPIECE HANDLING SYSTEMS

RELATED APPLICATION

This application is a continuation-in-part of application Ser. No. 09/294,301, filed Apr. 19, 1999, which is incorporated herein by reference in its entirety.

FIELD OF THE INVENTION

The present invention relates to automated workpiece handling systems, and more particularly, to methods and devices for aligning a cassette for workpieces and for aligning a robot for transferring workpieces in an automated workpiece handling system.

BACKGROUND OF THE INVENTION

In order to decrease contamination and to enhance throughput, semiconductor processing systems often utilize one or more robots to transfer semiconductor wafers, substrates and other workpieces between a number of different vacuum chambers which perform a variety of tasks. An article entitled "Dry Etching Systems: Gearing Up for Larger Wafers", in the October, 1985 issue of Semiconductor International magazine, pages 48–60, describes a four-chamber dry etching system in which a robot housed in a pentagonal-shaped mainframe serves four plasma etching chambers and a loadlock chamber mounted on the robot housing. In order to increase throughput, it has been proposed to utilize two loadlock chambers as described in U.S. Pat. No. 5,186,718. In such a two-loadlock chamber system, both loadlock chambers are loaded with full cassettes of unprocessed wafers. FIG. 1 of the present application illustrates two typical loadlock chambers LLA and LLB, each having a cassette 190 therein for holding unprocessed wafers 192 to be unloaded by a robot 194 in a transfer chamber 195 and transferred to various processing chambers 196 attached to a mainframe 198.

The loadlock chamber LLA, for example, is a pressure-tight enclosure which is coupled to the periphery of the mainframe 198 by interlocking seals which permit the loadlock chamber to be removed and reattached to the mainframe as needed. The cassette 190 is loaded into the loadlock chamber LLA through a rear door, which is closed in a pressure-tight seal. The wafers are transferred between the mainframe 198 and the loadlock chamber LLA through a passageway 199 which may be closed by a slit valve to isolate the loadlock chamber volume from the mainframe volume.

As shown in FIG. 2, a typical cassette 190 is supported by a platform 200 of a cassette handler system 208, which includes an elevator 210, which elevates the platform 200 and the cassette 190. The platform 200 has a top surface, which defines a base plane 220 on which the cassette 190 rests. As the cassette includes a plurality of "slots" 204 or wafer support locations, the elevator moves the cassette to sequentially position each of the slots with the slit valves to allow a robot blade to pass from the mainframe, through the slit valve, and to a location to "pick" or deposit a wafer in a wafer slot.

The slots 204 of the cassette may be initially loaded with unprocessed wafers or other workpieces before the cassette is loaded into the loadlock chamber LLA. The number of unprocessed wafers initially loaded into the cassette may depend upon the design of the cassette. For example, some cassettes may have slots for 25 or more wafers.

After the loadlock access door is closed and sealed, the loadlock chamber is then pumped by a pump system down to the vacuum level of the mainframe 198 before the slit valve is opened. The robot 194 which is mounted in the mainframe 198 then unloads the wafers from the cassette one at a time, transferring each wafer in turn to the first processing chamber. The robot 194 includes a robot hand or blade 206, which is moved underneath the wafer to be unloaded. The robot 194 then "lifts" the wafer from the wafer slot supports supporting the wafers in the cassette 190. By "lifting," it is meant that either the robot blade 206 is elevated or the cassette 190 is lowered by the handler mechanism 208 such that the wafer is lifted off the cassette wafer supports. The wafer may then be withdrawn from the cassette 190 through the passageway and transferred to the first processing chamber.

Once a wafer has completed its processing in the first processing chamber, that wafer is transferred to the next processing chamber (or back to a cassette) and the robot 194 unloads another wafer from the cassette 190 and transfers it to the first processing chamber. When a wafer has completed all the processing steps of the wafer processing system, the robot 194 returns the processed wafer back to the cassette 190 from which it came. Once all the wafers have been processed and returned to the cassette 190, the cassette in the loadlock chamber is removed and another full cassette of unprocessed wafers is reloaded. Alternatively, a loaded cassette may be placed in one loadlock, and an empty one in the other loadlock. Wafers are thus moved from the full cassette, processed, and then loaded into the (initially) empty cassette in the other loadlock. Once the initially empty cassette is full, the initially full cassette will be empty. The full "processed" cassette is exchanged for a full cassette of unprocessed wafers, and these are then picked from the cassette, processed, and returned to the other cassette. The movements of the robot 194 and the cassette handler 208 are controlled by an operator system controller 222 (FIG. 1), which is often implemented with a programmed workstation.

As shown in FIGS. 2 and 3, the wafers are typically very closely spaced in many wafer cassettes. For example, the spacing between the upper surface of a wafer carried on a moving blade and the lower surface of an adjacent wafer in the cassette may be as small as 0.050 inches. Thus, the wafer blade is often very thin, to fit between wafers as cassettes are loaded or unloaded. As a consequence, it is often preferred in many processing systems for the cassette and the cassette handler 208 to be precisely aligned with respect to the robot blade and wafer to avoid accidental contact between either the robot blade or the wafer carried by the blade and the walls of the cassette or with other wafers held within the cassette.

However, typical prior methods for aligning the handler and cassette to the robot blade have generally been relatively imprecise, often relying upon subjective visual inspections of the clearances between the various surfaces. Some tools have been developed to assist the operator in making the necessary alignments. These tools have included special wafers, bars or reference "pucks" which are placed upon the robot blade and are then carefully moved into special slotted or pocketed receptacles which are positioned to represent the tolerance limits for the blade motions. However, many of these tools have a number of drawbacks. For example, some tools rely upon contact between the blade or a tool on the blade and the receptacle to indicate a condition of nonalignment. Such contact can be very detrimental to high precision mechanisms for moving the blade as well as to the blade itself. Also, many such tools do not indicate the degree of alignment or nonalignment but merely a "go/no-go" indication of whether contact is likely.

In aligning the handler mechanism to the robot blade, one procedure attempts to orient the cassette to be as level as possible with respect to the robot blade. One tool that has been developed to assist in the leveling procedure has dual bubble levels in which one bubble level is placed on the blade and the other is placed on the cassette. The operator then attempts to match the level orientation of the blade to that of the cassette. In addition to being very subjective, such bubble tools have also often been difficult to see in the close confines of the cassette and handler mechanisms.

In addition to aligning the robot blade with respect to a cassette handler, in many systems the robot blade should be properly aligned with respect to the various chambers of the system in which the blade operates including the buffer, transfer and pass through chambers. Here too, prior procedures have typically relied upon subjective measurements including using tape measures to measure the distances of various portions of the robot blade to surfaces of the chamber. Other techniques have utilized mechanical gauges, which rely upon visual inspections which again, are typically very subjective.

As a consequence of these and other deficiencies of the prior alignment procedures and tools, alignments have often tended to be not only imprecise but also inconsistent from application to application. These problems have frequently led to the breakage or scratching of very expensive wafers and equipment as well as to the generation of damaging particulates in the systems.

SUMMARY OF THE INVENTIONS

The present inventions are, in one aspect, directed to an alignment tool, method and system for aligning a robot blade in a workpiece handling system, in which the tool comprises a frame or fixture adapted to be supported by a support surface in the system, and in which the frame has one or more distance sensors positioned to measure the distance of a workpiece or robot blade from the sensor or a predetermined reference point or surface. In one embodiment, the frame is placed on a chamber floor reference surface so that non-contact type distance sensors can directly measure the spatial orientation of a workpiece held by the robot blade within a frame opening relative to the chamber. In another embodiment, the frame emulates a workpiece cassette and the distance sensors provide a numerical output of the distance to the workpiece. As explained in greater detail below, these distance measurements facilitate accurately leveling the robot blade. As a consequence, accidental scratching and breakage of workpieces such as semiconductor wafers and display substrates may be reduced or eliminated.

In another aspect of the present inventions, the tool is adapted to facilitate ready repositioning of the distance sensors to accommodate aligning robot blades for wafers or other workpieces of different sizes. In the illustrated embodiment, releasable fasteners are removed and the distance sensors are reversed in orientation and refastened to the tool to shift the field of view of the sensors.

In another aspect of the present inventions, the frame has a predetermined reference surface positioned opposite the distance sensors of the frame. In a preferred embodiment, the frame reference surface is accurately positioned by the frame to be at a predetermined orientation and distance from a base reference point or surface such as a chamber floor or a cassette handler support surface. As a consequence, as explained in greater detail below, distance measurements to the workpiece or robot blade may be output as offsets from this predetermined frame reference surface which significantly facilitates calibrating the distance sensors.

In yet another aspect of the present inventions, a preferred embodiment includes a computer operated graphical user interface which can significantly facilitate rapid and accurate performance of alignment and setting procedures utilizing the alignment frame of the present inventions. Actual measurements may be compared to preferred values calculated or otherwise provided and appropriate adjustments made.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

Embodiments of the invention are described with reference to the accompanying drawings which, for illustrative purposes, are schematic and not drawn to scale.

FIG. 3A is an enlarged partial view of the wafer cassette of FIG. 3, depicting a wafer resting in a slot and a wafer picked up from a slot.

FIG. 11 is a schematic view of the display of the interface controller of the system of FIG. 4, during a wafer level measurement procedure.

FIG. 12a is a top view of the metrology cassette of FIG. 4.

FIG. 12b is a side view of the metrology cassette of FIG. 4.

FIG. 12c is a front view of the metrology cassette of FIG. 4.

FIG. 12d is a bottom view of the metrology cassette of FIG. 4.

DETAILED DESCRIPTION

Figure 4:
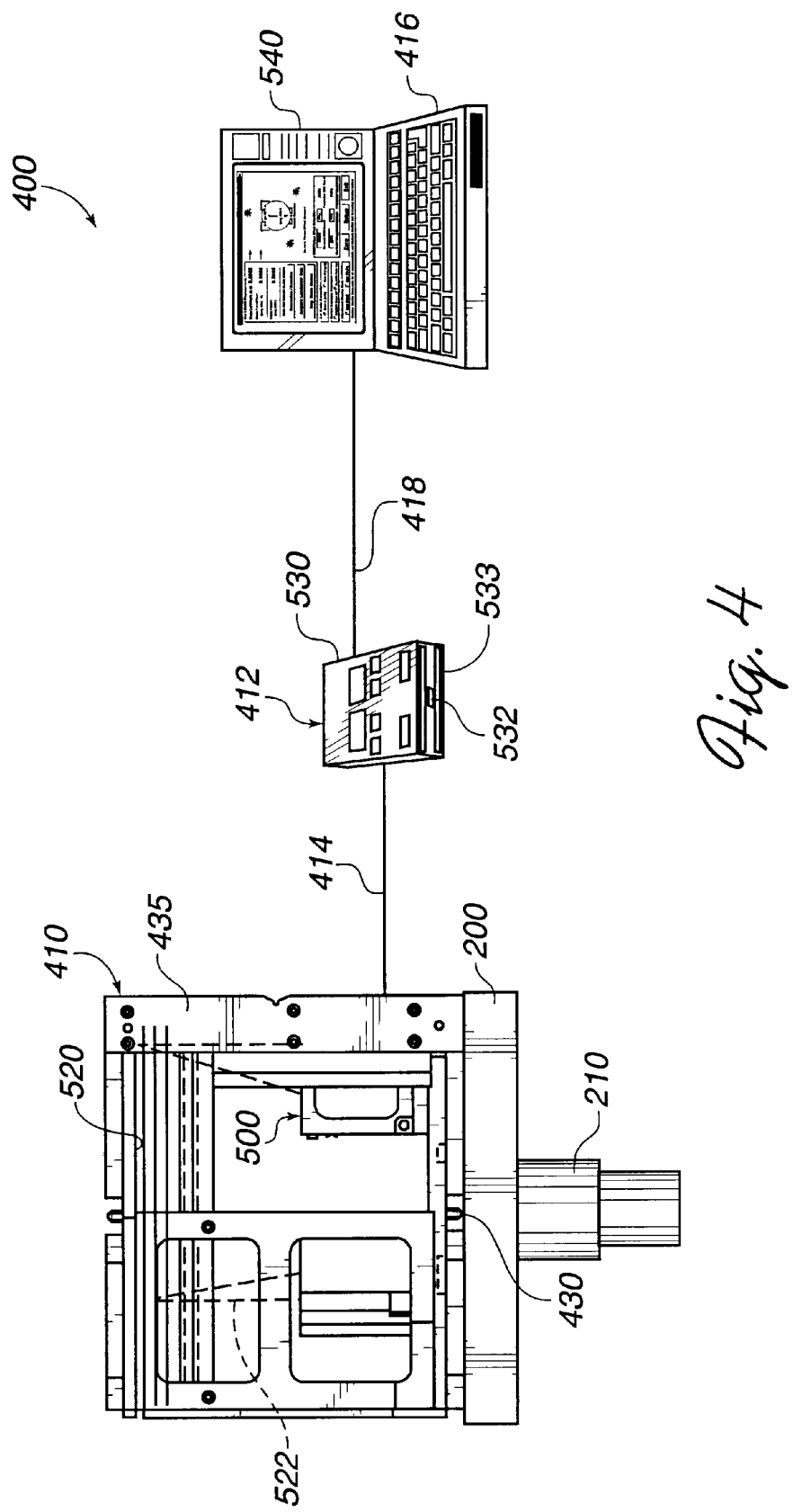
FIG. 4 is a schematic pictorial view of a cassette alignment tool system in accordance with an embodiment of the present invention.

A cassette alignment tool system in accordance with a preferred embodiment of the present invention is indicated generally at 400 in FIG. 4. The cassette alignment tool 400 comprises a metrology cassette 410, cassette controller 412 coupled by communication cables 414 to the metrology cassette 410, and a computer 416 coupled by a communication cable 418 to the cassette controller 412. The metrology cassette 410 is secured to the cassette handler platform 200 in the same manner as an actual wafer cassette such as the cassette 190 of FIG. 2 and thus emulates the wafer cassette 190. For example, the metrology cassette has alignment and registration surfaces including an H-bar 430 and side rails 570 which are received by the cassette handler to align the cassette with respect to the handler. In addition, the metrology cassette 410 approximates the size and weight of a production wafer cassette full of wafers.

The cassette alignment tool system 400 may be used with processing systems having one or many processing chambers and one or more workpiece handling systems for transferring workpieces from one or more cassettes in one or more loadlock chambers to one or more of the processing chambers. Once a particular handling system has been properly aligned and calibrated to the robot blade and workpiece, the metrology cassette 410 may be removed from the handler and processing of workpieces may begin using a standard workpiece cassette which was emulated by the metrology cassette 410. However, it is preferred that all handlers of a particular processing system be properly aligned prior to initiating processing of production workpieces.

In accordance with one aspect of the illustrated embodiments, the metrology cassette 410 has a distance measurement device 500 which can provide precise measurements of the position of a wafer or other workpiece being held by the robot blade within the metrology cassette 410. As explained in greater detail below, these wafer position measurements can be used to accurately align an actual wafer cassette such as the cassette 190 to the robot blade in such a manner as to reduce or eliminate accidental contact between the blade or the wafer held by the blade and the cassette or wafers held within the wafer cassette.

Figure 5:
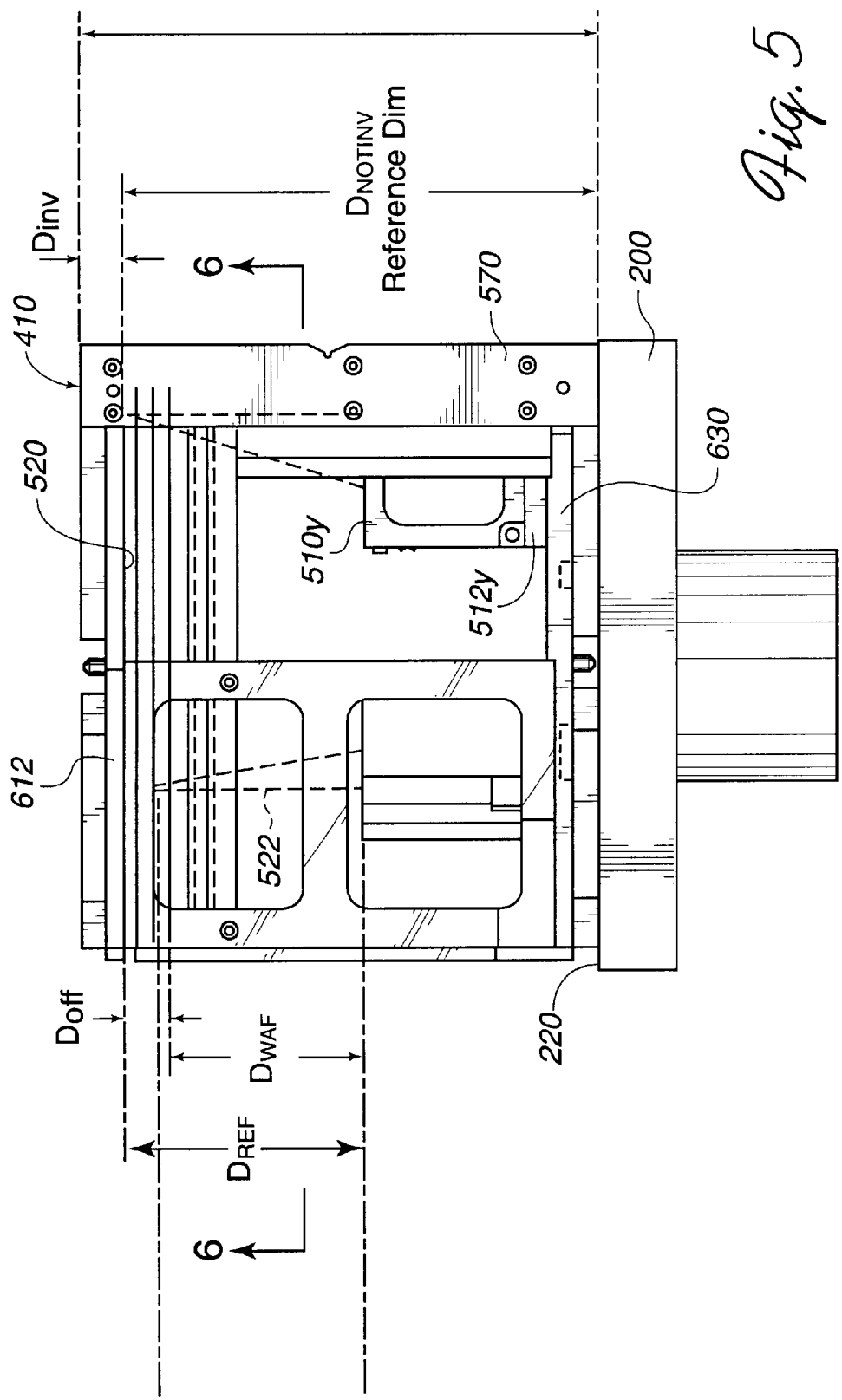
FIG. 5 is a side view of the metrology cassette of FIG. 4.
Figure 6A:
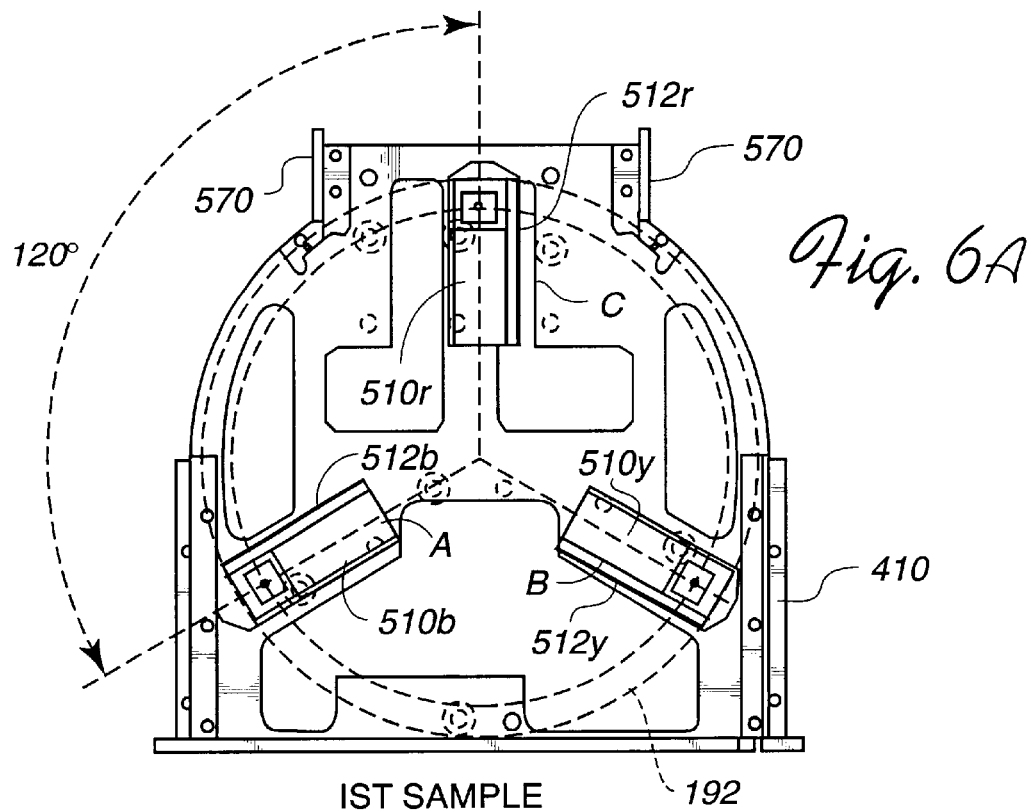
FIGS. 6A, 6B and 6C are a schematic partial cross-sectional top views of the metrology cassette of FIG. 5, showing distance sensors in various configurations.

As best seen in FIGS. 5 and 6A, in the illustrated embodiment, the distance measurement device 500 of the illustrated embodiment includes three laser sensors A, B and C, each of which includes a laser head 510b, 510r or 510y, which is clamped in a mounting 512b, 512r or 512y, respectively, carried by the metrology cassette 410. The mountings 512b, 512r and 512y are preferably color coded and mechanically keyed to reduce or eliminate inadvertent exchanges or misplacements of the laser heads in the mountings. Thus, the mountings 512b, 512r and 512y may be color coded blue, red and yellow, respectively, for example. In the illustrated embodiment, the mountings are brackets but may have a variety of other mechanical shapes, depending upon the particular application.

In the illustrated embodiment, the distance sensors are laser sensors manufactured by NaiS/Matsushita/Panasonic (Japan), model ANR12821 (high power) or ANR11821 (low power). This particular laser sensor operates based upon perpendicular beam, scattered reflection triangulation using a position sensing diode array. The beam from the light source (in this embodiment, a laser) impinges upon the target perpendicular to the surface of the target, preferably within a relatively small angle. The surface preferably provides a diffuse reflection that is visible to the sensing device over a relatively wide angle. The field of view of the sensing device is focused upon a receptor (a linear optical sensor in this embodiment), the output of which is interpreted to determine the displacement of the target surface within the field of view. The geometry of the light path therefore forms a right triangle with light from the light source traveling along the vertical edge and reflected light of the return path traveling along the diagonal. The distance between the sensor and the target may then be calculated using the Pythagorean theorem.

Although the distance sensors are described in the illustrated embodiments as three laser sensors, it is appreciated that other types and numbers of distance measuring sensors may be used. For example, there are several different techniques and methods utilized by commercial laser distance sensors. These include scattered light triangulation, reflective triangulation, perpendicular and angled beam triangulation, time delta, interference pattern deciphering, CCD array sensors, position sensing diode sensors, position sensing photoresistor sensors, etc. It is anticipated that a variety of optical and non-optical based distance measuring sensors may be suitable as well. It is preferred that the distance sensors be of the non-contact type such that there is no contact between the distance sensor and the workpiece or other target object for which the distance to the target object is being measured.

Figure 6B:
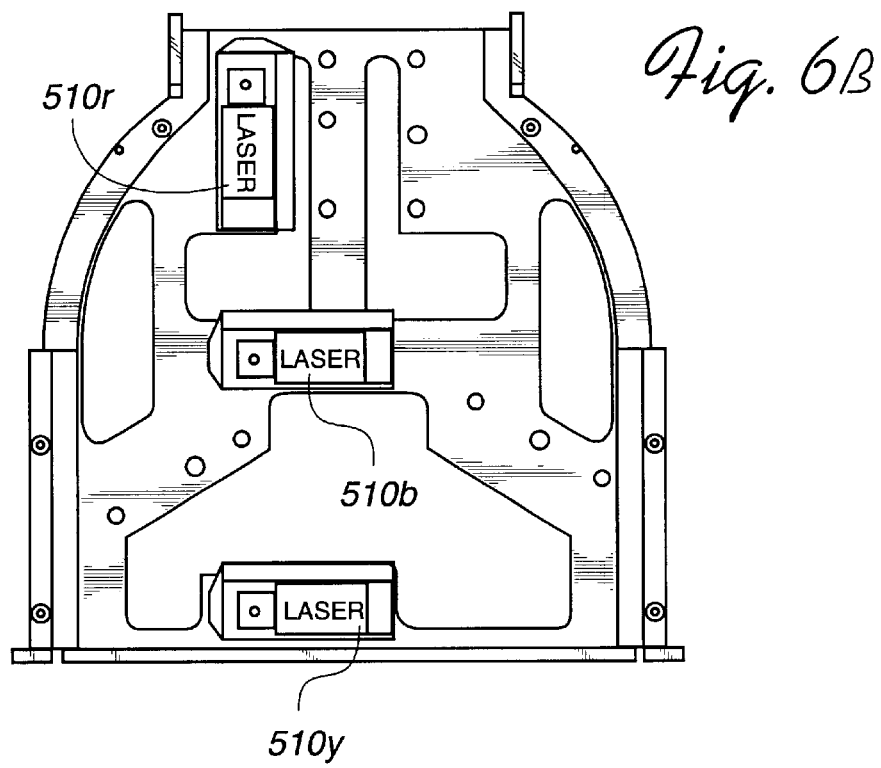

In the embodiment of FIG. 6A, the heads 510b, 510r and 510y of the laser sensors are positioned in an equilateral triangular placement which facilitates a three point plane distance determination for measuring the height of a surface such as a wafer surface. As explained in greater detail below, the laser heads may be readily repositioned to other placements including an in-line placement for blade motion mapping (FIG. 6B), and a modified right triangle placement (FIG. 6C) for on-blade measurements.

Sensor Calibration

In another aspect of the illustrated embodiments, the metrology cassette 410 includes a precision internal reference surface which defines a reference plane 520 (FIG. 5) which provides fixed reference points from which all measurements may be gauged. It is fixed at the top of the cassette whereas the laser sensors are fixed to the bottom. The laser sensor light beams 522 are intercepted by the reference surface 520 when no wafer is present inside the metrology cassette 410 and are reflected by the surface 520 back to the laser heads of the laser sensor.

In the illustrated embodiment, the metrology cassette 410 is manufactured so that the reference surface 520 is relatively flat and parallel with respect to the base plane 220 of the platform 200 of the cassette handler to a relatively high degree of precision. All subsequent distance measurements of the wafer can be made as offsets to this reference surface 520. Because of the effects of temperature and aging of electronics, the output of the laser sensors can often vary over time. Thus, the actual value of the laser measurements of the distance $D_{REF}$ between the laser sensors and the reference surface 520 can also vary over time even though the actual distance remains fixed. However, because all subsequent distance measurements of the wafer are made as offsets to this reference surface 520, whatever value the lasers determine the distance $D_{REF}$ between the laser sensors and the reference surface 520 to be, that value is considered to be the "zero" distance. Any subsequent measurement of wafer position is calculated as the difference or offset $D_{OFF}$ between the measured reference distance $D_{REF}$ and the measured wafer distance $D_{WAF}$. Hence, calibrating the laser sensors is simply a matter of turning the laser sensors on and after a sufficient warm up time, noting the measured reference distance $D_{REF}$ and assigning that value as the "zero" distance.

For example, in the illustrated embodiment, once the cassette alignment tool system 400 has powered up properly the operator will see three (3) red laser light spots on the reference surface 520. For some laser sensors, it may take up to five seconds for the laser spots to appear. As the laser heads warm up, the distance values displayed for each laser head by the interface controller display 530 (FIG. 7) may fluctuate. To ensure adequate warm up time for the displayed values to stabilize, the interface controller 412 may include a built-in timer which displays a warm-up timing bar at the bottom of a display 530 which may be an LCD display for example. Other types of displays may be used including the display 540 of the computer 416 which may display a graphical user interface (GUI). The warm-up timing bar on the bottom line of the display 530 may be programmed to disappear when the laser heads have warmed up, typically in about five (5) minutes.

When the warm-up is complete the bottom line will display "*WARMUP COMPLETED*". At this time, the interface controller display 530 will display the raw distance values next to "blue", "yellow" and "red" labels for each laser's output. As explained in greater detail below, the outputs of the metrology cassette 410 laser sensors are sampled and averaged over a period of time sufficient to substantially cancel out noise and vibration effects.

Figures 6C, 7:
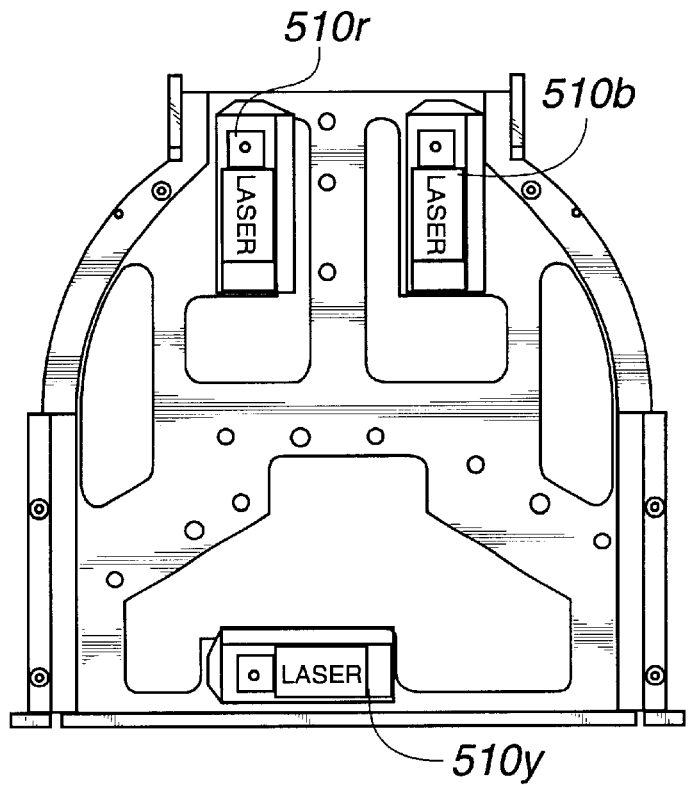
FIG. 7 is a schematic view of display of the interface controller of the system of FIG. 4.

The operator may now "zero", or calibrate the cassette alignment tool system 400 by pressing a button 532 on the interface controller 412, which is labeled "ZERO". In response, the system assigns the three distance values measured by the three laser heads to be the distance $D_{REF}$ between that laser sensor and the reference surface 520 for each laser head. In that this distance value for each laser is the "zero" distance, the displayed measurement values for each laser head, labeled "blue", "yellow" and "red", are set to indicate 0.000 as shown in FIG. 7. Calibration of the laser sensors is thus completed in a simple manner without requiring any external instruments or tools.

Figure 7A:
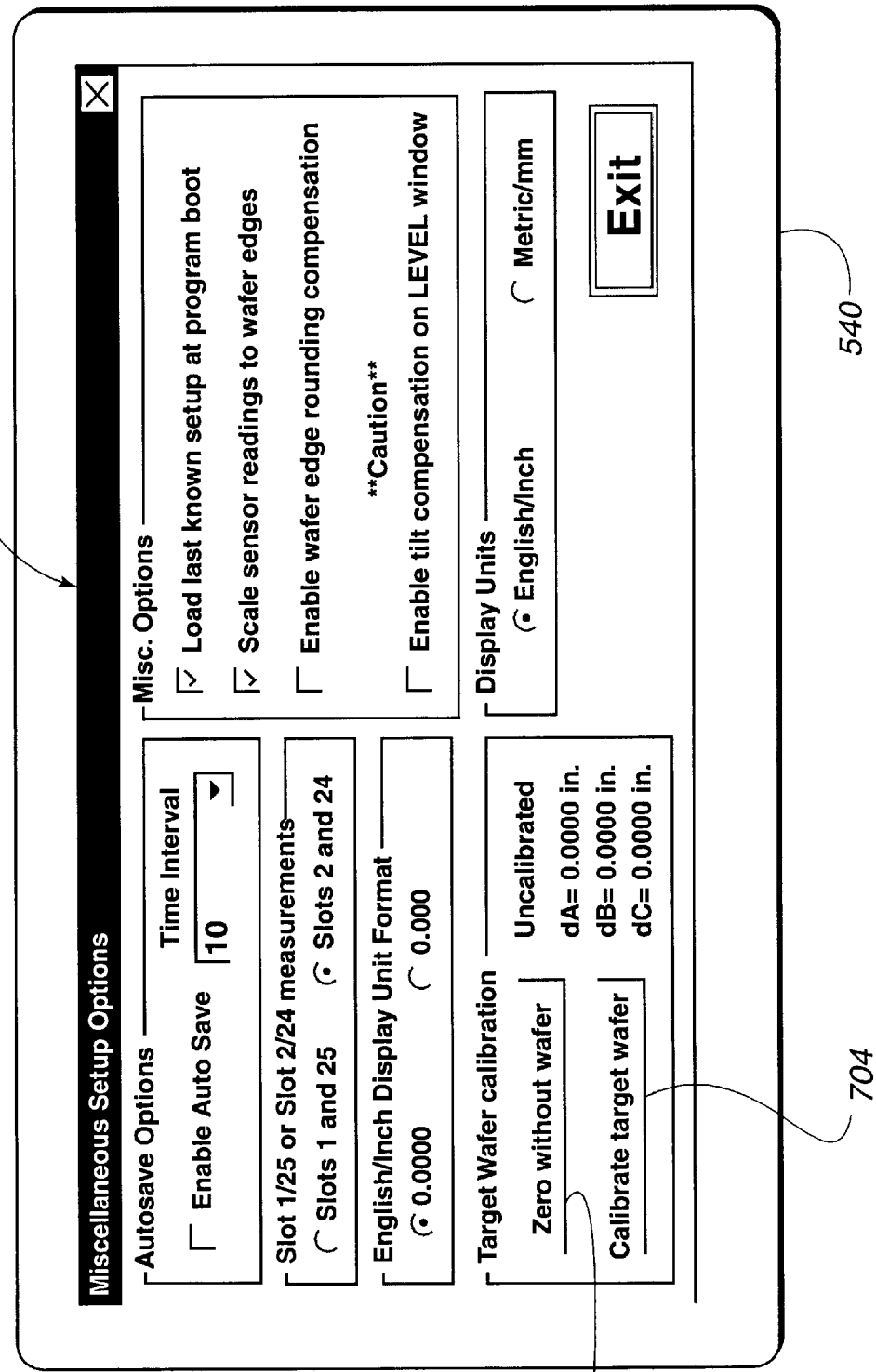
FIG. 7A is a view of the computer display of FIG. 4, depicting an input-output screen used in a calibration procedure.

FIG. 7A shows an example of an input-output screen 700 of a graphical user interface of the display 540 of the computer 416 that may also be used to calibrate the distance sensors. The screen 700 has a "button" 702 labeled "zero without wafer" which may be activated by the operator moving the display cursor over the button 702 and depressing the appropriate mouse or other input device button. Again, in response, the system assigns the three distance values measured by the three laser heads to be the distance $D_{REF}$ between that laser sensor and the reference surface 520 for each laser head. The three distance values dA, dB and dC for the three laser heads A, B and C, respectively, are each assigned an output value of 0.0000 inches as shown in the screen of FIG. 7A.

Although the reference surface 520 of the metrology cassette 410 of the illustrated embodiment is described as being flat and parallel, it is appreciated that other shapes and orientations of reference surfaces and points may be used, depending upon the application. It is further appreciated that the distance sensors such as the laser sensors illustrated may be calibrated in other techniques such that the reference surface may be eliminated in some embodiments. For example, the sensors may be periodically calibrated using external reference surfaces or may be calibrated electronically.

Also, the computer 416 is illustrated as a standard "laptop" size computer. A variety of computing devices may be used including workstations and dedicated processors. The computer 416 preferably has memory including short term and mass storage memory as well as processors and input-output devices including keyboards, printers, display screens and mouse or other pointing devices. The computer 416 is preferably programmed to facilitate the implementation of the procedures discussed herein.

Workpiece Target Surface Calibration

In accordance with another aspect of the present embodiments, it is recognized that targets being sensed by distance sensors may respond to the distance sensors in different manners. For example, in the illustrated embodiment, laser sensors are used to measure the distance from the sensor to the reference surface 520 and also to measure the distance to a workpiece, which is a silicon wafer in the illustrated embodiment. These sensors operate on the principle of the target having a surface which reflects a light wave emitted by the sensor, back to the sensor. The sensors of the illustrated embodiment emit laser beams in the red visible range. However, a small portion of the emission is in the near-infrared range, and the back sides of silicon wafers have a degree of transparency to infrared radiation. As a consequence, the infrared portion of the radiation from the laser sensors is typically not reflected by the outermost exterior surface of the silicon wafer but is usually reflected at an internal depth within the silicon wafer. By comparison, the reference surface 520 of the illustrated embodiment has a treated surface which preferably reflects the sensor beam more closely from the actual exterior of the reference surface.

Because the reference surface and the workpiece may respond differently to the sensor beams from the sensors, an error or deviation may be introduced into the measurements of the true distances. The responsiveness of the target surface of the workpiece and the target surface of the reference surface 520 may be measured and compared to determine any such difference which may be expressed as a correction factor. This correction factor may then be applied to distance measurements of the target workpiece to compensate for the manner in which the target workpiece responds to the sensor beams and thereby reduce or eliminate any such error caused by such differences.

To determine the correction factor, the distance sensors are first calibrated in the manner discussed above with no wafer present in the metrology cassette. Thus, the "button" 702 labeled "zero without wafer" of the screen 700 may be activated by the operator moving the display cursor over the button 702 and depressing the appropriate mouse or other input device button. Accordingly, the laser beams emitted by the laser sensors and reflected by the reference surface 520 are sensed to provide the reference distances $D_{REF}$ to the reference surface for each laser head.

Figure 13:
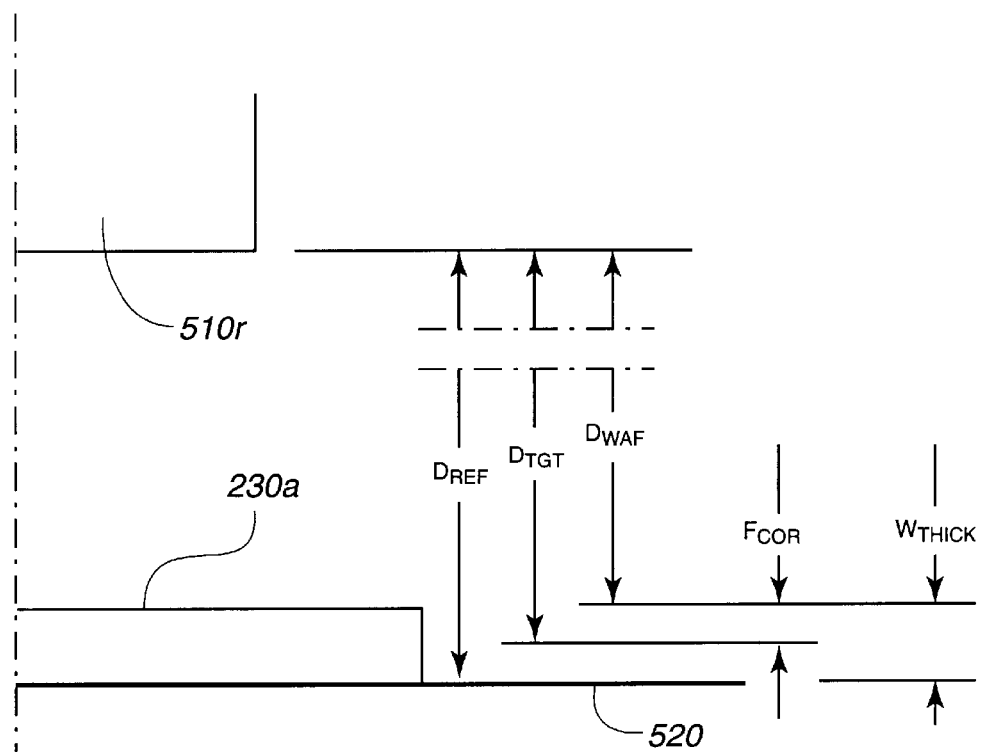
FIG. 13 is a partial schematic view of a wafer resting on the reference surface of the metrology cassette in an inverted position.

The metrology cassette 410 may then be inverted and placed on a suitable supporting surface. In this position, a wafer 230a may be conveniently positioned on and supported by the metrology cassette reference surface 520. In this position, the laser sensing beams are reflected by the wafer 230a rather than the reference surface 520. If the laser beams are reflected by the exterior surface of the wafer, the distance measurement $D_{TGT}$ to the target would change by the thickness $W_{THICK}$ of the wafer. However, because silicon wafers have a degree of transparency to infrared radiation, the measurement of the distance from the sensors to the wafer provides a measurement value $D_{TGT}$ which differs from the previously measured reference distance $D_{REF}$ to the reference surface 520 by a value which is less than the thickness of the wafer as shown in FIG. 13. By comparing this difference value ($D_{REF}-D_{TGT}$) to the known thickness $W_{THICK}$ of the wafer, the correction factor $F_{COR}$ may be calculated as $F_{COR}=W_{THICK}-(D_{REF}-D_{TGT})$. Thus, upon activating a "calibrate target wafer" button 704 (FIG. 7A), the distance $D_{TGT}$ from the sensors to the wafer is noted for each laser head such as laser head 510r and used with the previously measured reference distance $D_{REF}$ to the reference surface 520 and the known wafer thickness $W_{THICK}$ to calculate the correction factor $F_{COR}$ for each laser head. Subsequent measurements of the distance to the wafer may then be corrected by subtracting the correction factor $F_{COR}$ from the measured distance value $D_{TGT}$ to provide the corrected distance $D_{WAF}$ which is a more accurate representation of the distance from a laser head sensor to the outer surface of the wafer.

The tool of the illustrated embodiment may be used with a variety of target workpieces. Because the response of a target such as a silicon wafer to a distance sensor such as a laser sensor may vary from wafer to wafer, it is preferred that the same wafer be used for subsequent aligning and calibration procedures discussed below. It should also be appreciated that correction factors may be determined for other types of targets and sensors, correcting for the variations in the manner in which particular targets respond to particular sensors. The target wafer of the illustrated embodiment is a standard unprocessed silicon wafer in which the back side is directed toward the sensors. Other types of targets may be used including ceramic wafers. In addition to placing the target wafer on the reference surface 520 for target surface calibration when the metrology cassette is placed in the inverted position, the target may also be affixed to the reference surface by an appropriate mechanism when the metrology cassette is in the noninverted position.

Cassette Handler Leveling

In aligning a wafer cassette to a robot blade, it is preferred that the wafer cassette be arranged so that wafers stacked within the cassette are as parallel as possible to a wafer held within the pocket of the robot blade when inserted into the cassette. One parameter which can affect wafer insertion is the alignment of the blade to the cassette slots, which are provided by thin flat or angled shelves or teeth 1912 extending outward from the sidewall of the cassette, and designed to hold the wafers parallel to the base of the cassette. Accordingly, cassette handlers typically have various adjustment mechanisms on the platform 200 of the cassette handler which adjusts the forward/backward and left/right tilt of the platform so that the base of the cassette secured to the platform, and thus the shelves upon which the wafer sits, are oriented parallel to the robot blade. These forward/backward and left/right adjustments to the platform are typically referred to as "leveling" the cassette handler although achieving a true horizontal leveling is typically not the goal.

As explained below, a cassette alignment tool system 400 in accordance with a preferred embodiment of the present invention readily permits the cassette handler to be "leveled" relative to the wafer blade both quickly and very accurately. Instead of relying upon visual estimates or the mechanical contact tools of prior methods, the cassette alignment tool system 400 of the illustrated embodiments accurately measures the left/right and forward/back displacements of a robot blade carrying a wafer relative to the reference plane 520 of the metrology cassette 410 and provides a numerical output indicating both the direction and amount of each displacement. Using this information, the operator can readily adjust the cassette handler until the system 400 indicates that the amount of left/right and front/back displacements are zero or within tolerance. The following provides an example of such a cassette handler leveling operation for a typical loadlock chamber designated "LLA".

Figure 1:
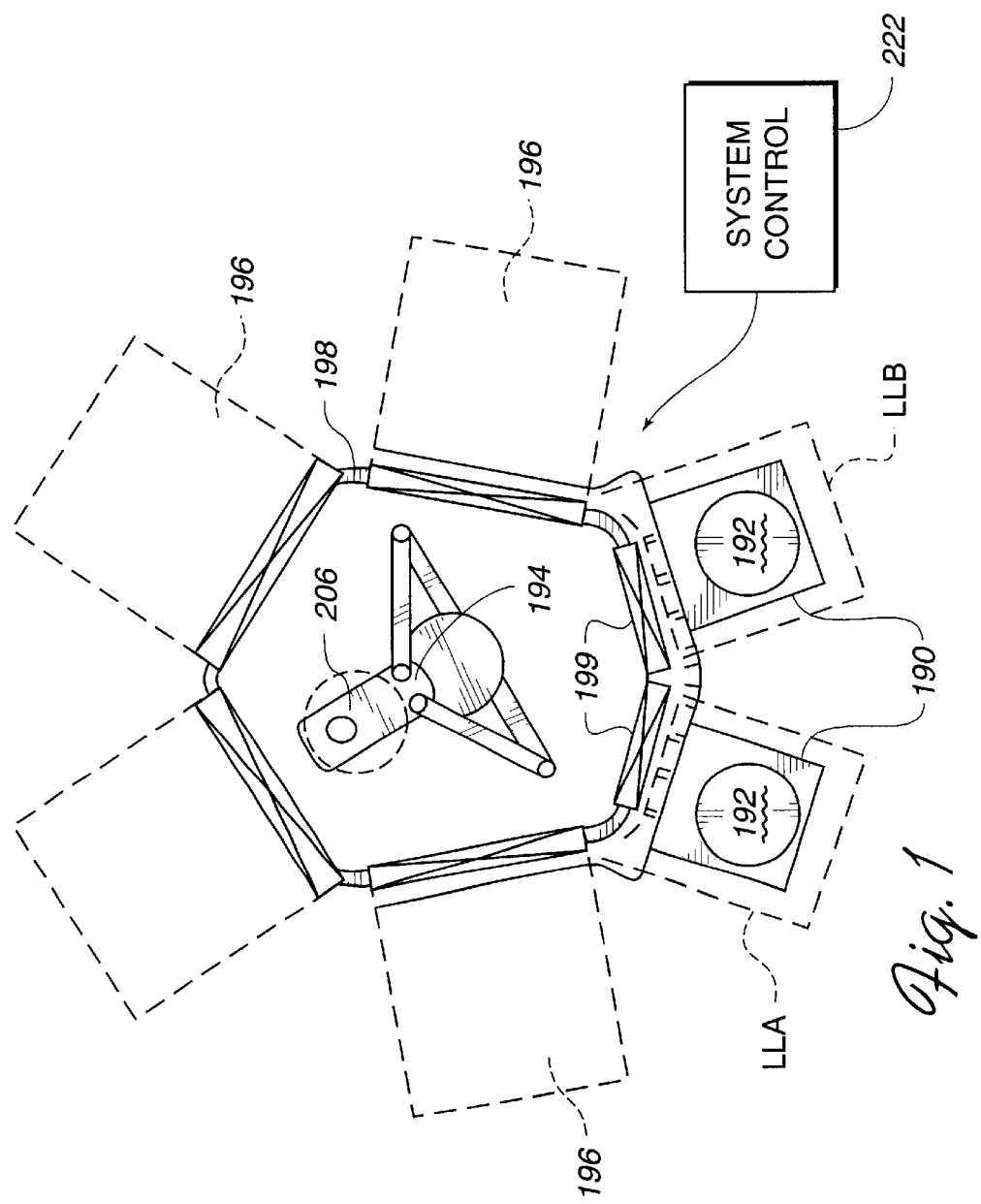
FIG. 1 is a schematic top view of a typical deposition chamber having two loadlock chambers.
Figure 2:
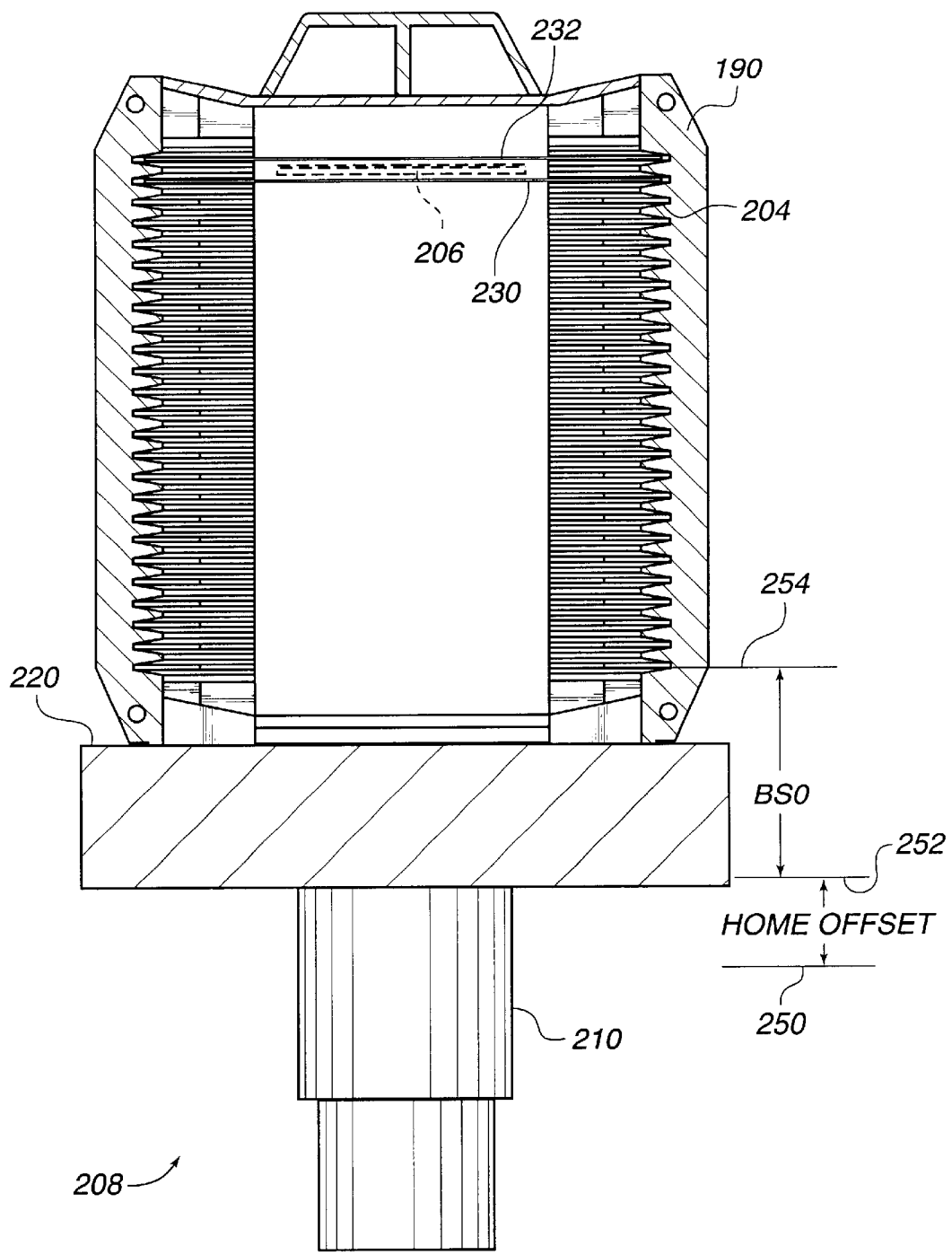
FIG. 2 is a schematic front view of a typical wafer cassette disposed on a platform of a cassette handling system.
Figure 3:
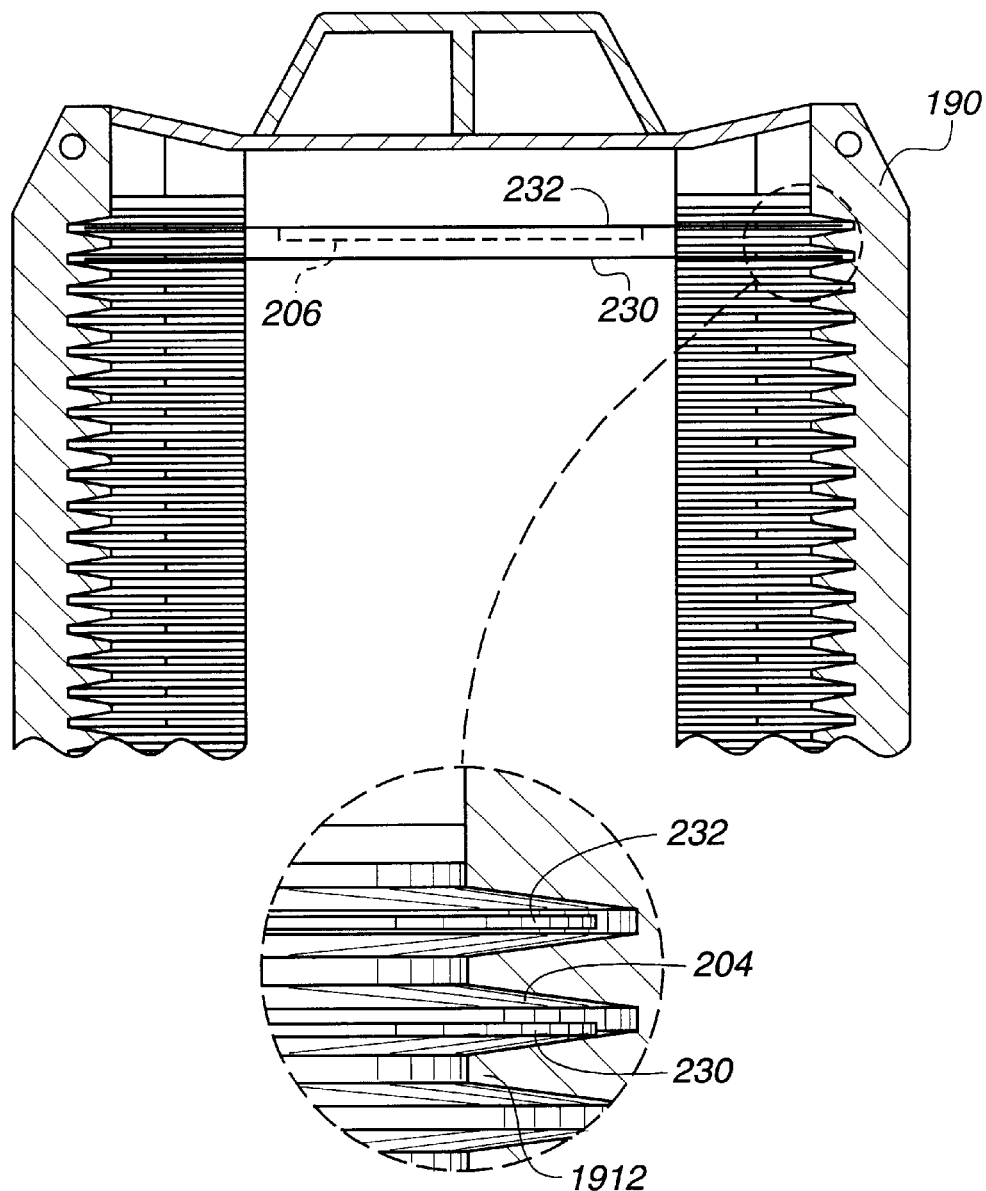
FIG. 3 is a partial view of the wafer cassette of FIG. 2, depicting a wafer resting in a slot and a wafer picked up from a slot.
Figure 8:
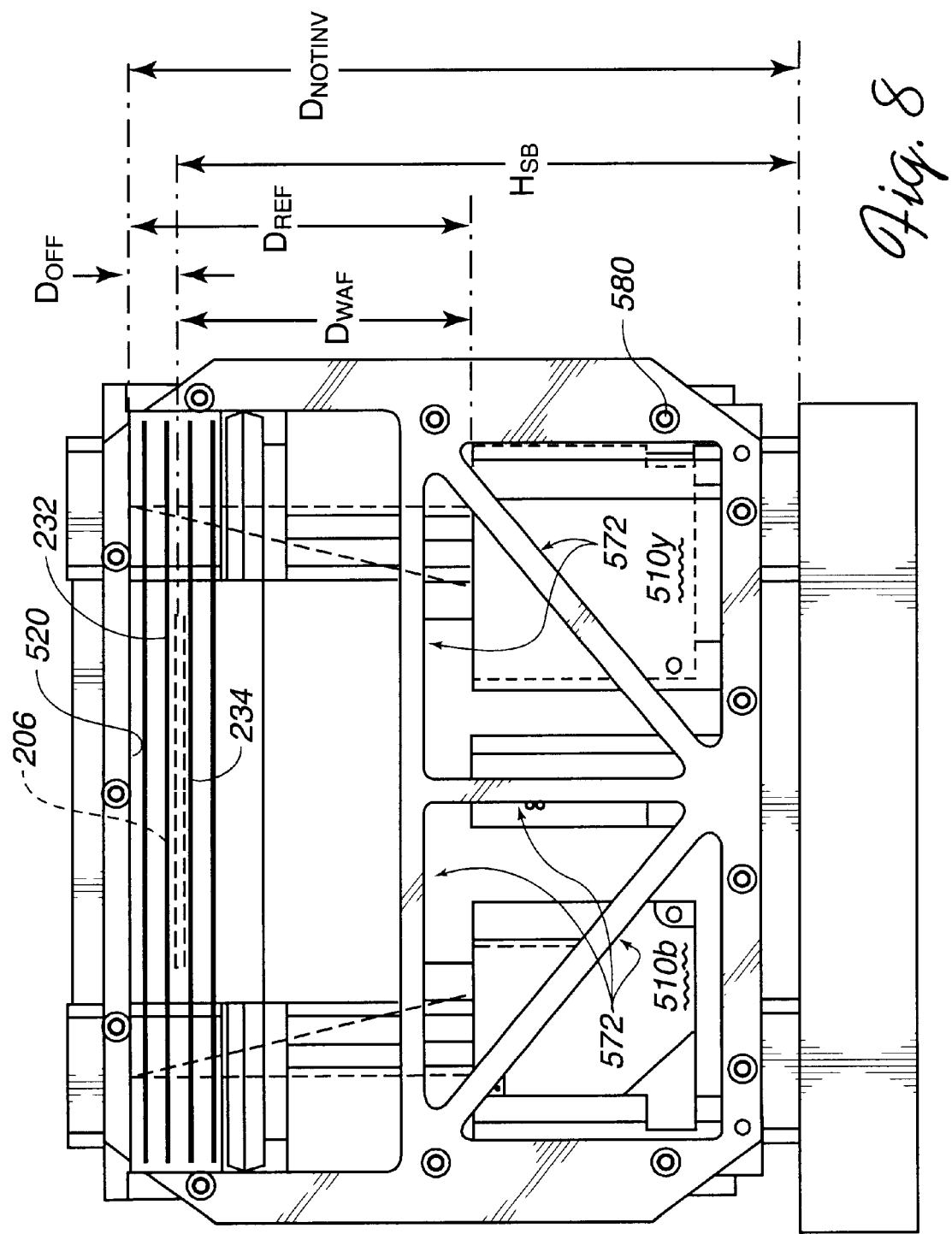
FIG. 8 is a front view of the metrology cassette of FIG. 4.

First, the operator causes the robot to extend the robot blade into loadlock "LLA" to the "drop position" so that the operator can place a clean wafer in the blade pocket. To facilitate light beam reflection by the wafer, it is preferred that the mirror side of the wafer be placed face up, with the dull silver side down to face the laser sensors. The robot blade is then retracted back in the transfer chamber to the zero position, with the wafer properly in the robot blade pocket. The metrology cassette 410 of the cassette alignment tool system 400 is then placed on the loadlock "LLA" cassette handler platform in the same manner as a standard plastic cassette. Using the system controller, the loadlock "LLA" cassette handler moves the metrology cassette 410 to "slot base 24". A "slot base" position is a cassette position relative to the robot blade in which the blade is preferably midway between two wafers resting in consecutive slots. For example, FIG. 2 illustrates the slot base 25 position for wafer cassette 190 which is the vertical position of the wafer cassette 190 when the robot blade 206 is midway between two wafers 230 and 232 resting in consecutive slots 24 and 25, respectively, of the wafer cassette 190. The metrology cassette 410 of the illustrated embodiment does not have actual slots for supporting wafers. However, in that the metrology cassette 410 is emulating the wafer cassette 190, the positions of the wafer slots formed between adjacent shelves for a production cassette can be readily supplied from the cassette manufacturer, in terms of a distance offset relative to the reference plane 520. Thus, for this leveling procedure, FIG. 8 shows the effective slot base 24 position for the metrology cassette 410 when the robot blade 206 is midway between two imaginary wafers 234' and 232' resting in consecutive imaginary slots 23 and 24, respectively, of the metrology cassette 410. The operator may visually check the location of the metrology cassette 410 and the cassette handler to ensure that it is at "slot base 24" for load lock "LLA". The cassette alignment tool system 400 may then be calibrated by pushing the Zero button on the cassette alignment tool system 400 controller 412 as described above to ensure that "L/R" and "F/B" displayed values on the display 530 of the interface controller are both reading 0.0000 as shown in FIG. 7. The L/R displayed value is the difference between the distance measurements of the blue and yellow laser heads 510b and 510y, respectively, which are disposed on the left and right, respectively as shown in FIG. 6A. The F/B reading is the difference between the averaged distance measurement of the blue and yellow laser heads 510b and 510y, respectively, which are disposed in the front of the metrology cassette 410, and the red laser head 510r which is disposed in the back of the metrology cassette 410 as shown in FIG. 6A. Because the robot blade and wafer have not yet been extended into the metrology cassette 410, the light beams of the laser distance sensors will intercept the cassette reference surface 520. As previously mentioned, the distance measurements of the three lasers to the flat, parallel reference surface 520 during the "zeroing" operation are calibrated to be output as zero. Thus, the difference between the left and right laser distance measurements is assigned an L/R output of zero and the difference between the front and back laser distance measurements is assigned an F/B output of zero.

Following calibration of the lasers, the robot blade and wafer may be extended into the cassette alignment tool system 400 metrology cassette 410 preferably making sure there is no contact from the robot blade and wafer with any part of the cassette alignment tool system 400 metrology cassette 410. The robot blade and wafer may be stopped at the "wafer drop" position which is the position at which the blade drops a wafer into a slot or picks a wafer up from a slot. Transfer robot movements are typically commanded through a processing system controller.

After the robot blade is moved into the tool, the distance $D_{WAF}$ (FIG. 8) from each laser sensor to the bottom surface of the wafer on the robot blade is measured by the three sensors. After allowing a few seconds for the reading on the display 530 of the interface controller to stabilize, the outputs labeled "L/R" and "F/B" may be noted. The offset distances $D_{OFF}$ from the reference surface 520 to the wafer ($D_{REF}-D_{WAF}$) may then be displayed for each laser head as shown in FIG. 11. In the example of FIG. 11, the offset distance $D_{OFF}$ for each laser sensor is displayed as 1.333 which will be the same for each sensor if the robot blade is properly leveled relative to the cassette reference surface 520. Since the L/R displayed value is the difference between the distance measurements of the blue and yellow laser heads 510b and 510y, respectively, which are disposed on the left and right, respectively as shown in FIG. 6A, the L/R displayed value will be 0.0000 if the cassette is properly leveled in the left-right direction. Similar, because the F/B reading is the difference between the averaged distance measurement of the blue and yellow laser heads 510b and 510y, respectively, which are disposed in the front of the metrology cassette 410, and the red laser head 510r which is disposed in the back of the metrology cassette 410 as shown in FIG. 6A, the F/B displayed value will be 0.0000 if the cassette is properly leveled in the front-back direction. Thus, if the cassette is leveled to the robot blade both readings will be 0.0000. If not, the cassette will need to be leveled relative to the robot blade.

The cassette handler of the illustrated embodiment has three leveling screws which may be individually adjusted to change the front/back and left/right orientation of the platform 200, and thus the cassette to the robot blade. These leveling screws are graphically represented in a convenient computer display output 800 shown in FIG. 9, the relevant portion of which is shown in an enlarged view in FIG. 10. As shown therein, the three leveling screws are labeled #1, #2 and #3, respectively.

The following provides an example of use of a cassette alignment tool in accordance with an embodiment of the present invention for leveling a cassette handler. Of course, the procedure may be readily modified to accommodate the particular leveling adjustment mechanism of the particular handler being used.

First, the operator levels the handler in the front to back (F/B) direction by adjusting the slotted screw labeled #1 about ¼ of a turn clockwise (CC) for example, and allowing the F/B measurement displayed by the interface controller display 530 (FIG. 11) to stabilize after the change. If the F/B reading becomes a smaller value (closer to the 0.000), the operator should continue to adjust the #1 screw until the F/B becomes 0.000. If the display F/B value becomes larger, the operator can turn the #1 screw counterclockwise (CCW). It is preferred that the operator make small adjustments, waiting for the display reading to stabilize before making the next adjustment.

Next, the handler may be leveled in the left to right (L/R) direction by adjusting the slotted screw labeled #3 using the same method of adjustment described above. The operator preferably should not need to adjust slotted screw #2 unless the operator cannot level the cassette within the desired tolerance such as 0.0020, for example, in both the F/B and L/R directions. When both of the F/B and L/R readings are 0.0020 or better, the cassette platform is level to the robot blade.

As previously mentioned, the metrology cassette 410 is emulating the wafer cassette 190. In that the dimensions of the blade, wafer and wafer cassette are known or can be measured, a preferred slot base position can be calculated for each slot base of the cassette 190. Such a preferred slot base position for slot base 24 is represented as a height $H_{sb}$ (FIG. 8) above the plane of the base plane 220 of the platform 200. Similarly, the calculated preferred slot base position may be represented as an offset distance $D_{sb}$ from the cassette reference surface 520.

To facilitate leveling the cassette relative to the robot blade, the laser distance measurements by the laser sensors to the underside of the wafer held by the robot blade relative to the reference surface 520 when the robot blade is inserted into the cassette may be output to the operator as displacements from the calculated preferred slot base position $D_{sb}$ measured from the cassette reference surface 520.

Figure 9:
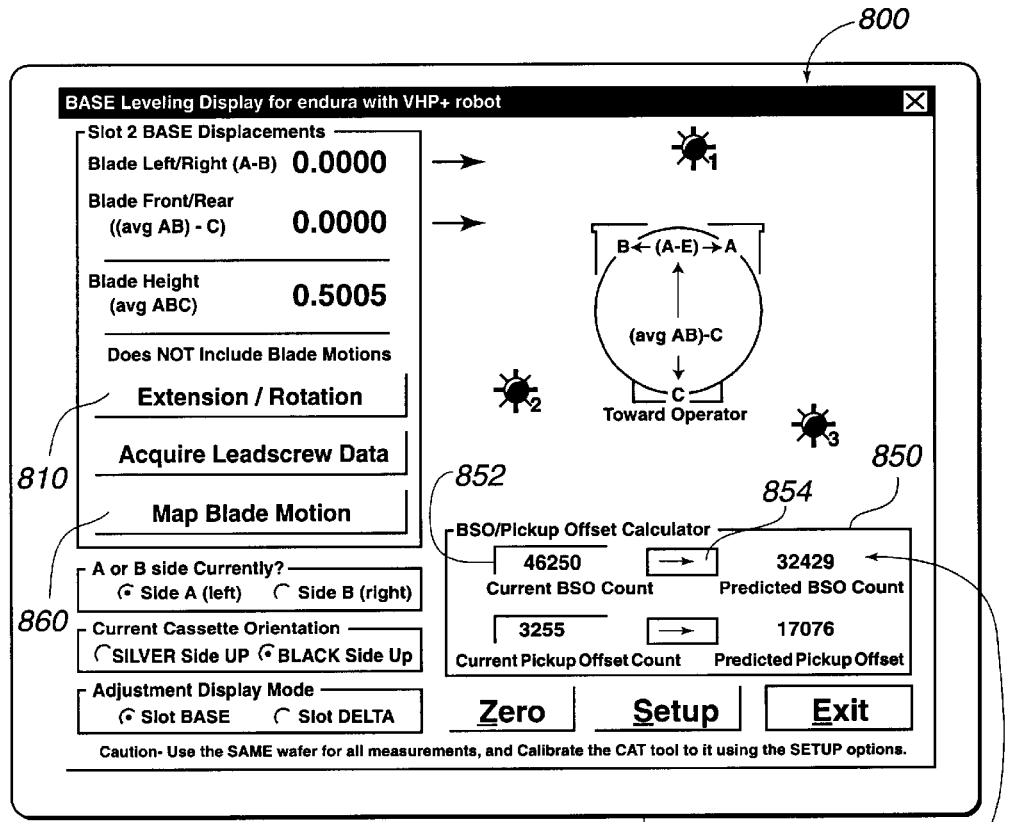
FIG. 9 is a view of the computer display of FIG. 4, depicting an input-output screen used in a calibration and leveling procedure.
Figure 10:
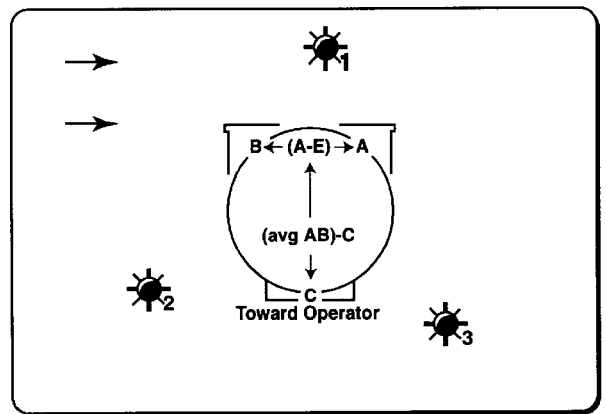
FIG. 10 is an enlarged view of a portion of the screen of FIG. 9, graphically depicting the leveling inputs for a typical cassette handler platform.

FIG. 9 shows the computer display screen 800 having an output labeled "Blade Left/Right (A–B)" which is similar to the L/R output of the interface controller display discussed above. However, the displayed value "A−B" is the difference between the two displacements, one measured by the blue (left) laser 510b and one measured by the yellow (right) laser 510y, from the calculated preferred slot base position $D_{sb}$. Another output labeled "Blade Front/Rear (avg AB)−C)" is similar to the F/B output of the interface controller display but the value "C" is the displacement measured by the red (back) laser 510r, from the calculated preferred slot base position $D_{sb}$. If the cassette is leveled to the robot blade, both readings will be 0.0000 because the displacements from the preferred slot base position will be zero for each laser, indicating a level condition. If not, the operator can level the cassette to the robot blade in the same manner described above, adjusting the leveling screws until the desired 0.0000 readings (or within tolerance) are obtained.

Lower Slot Position Calibration

Figure 14:
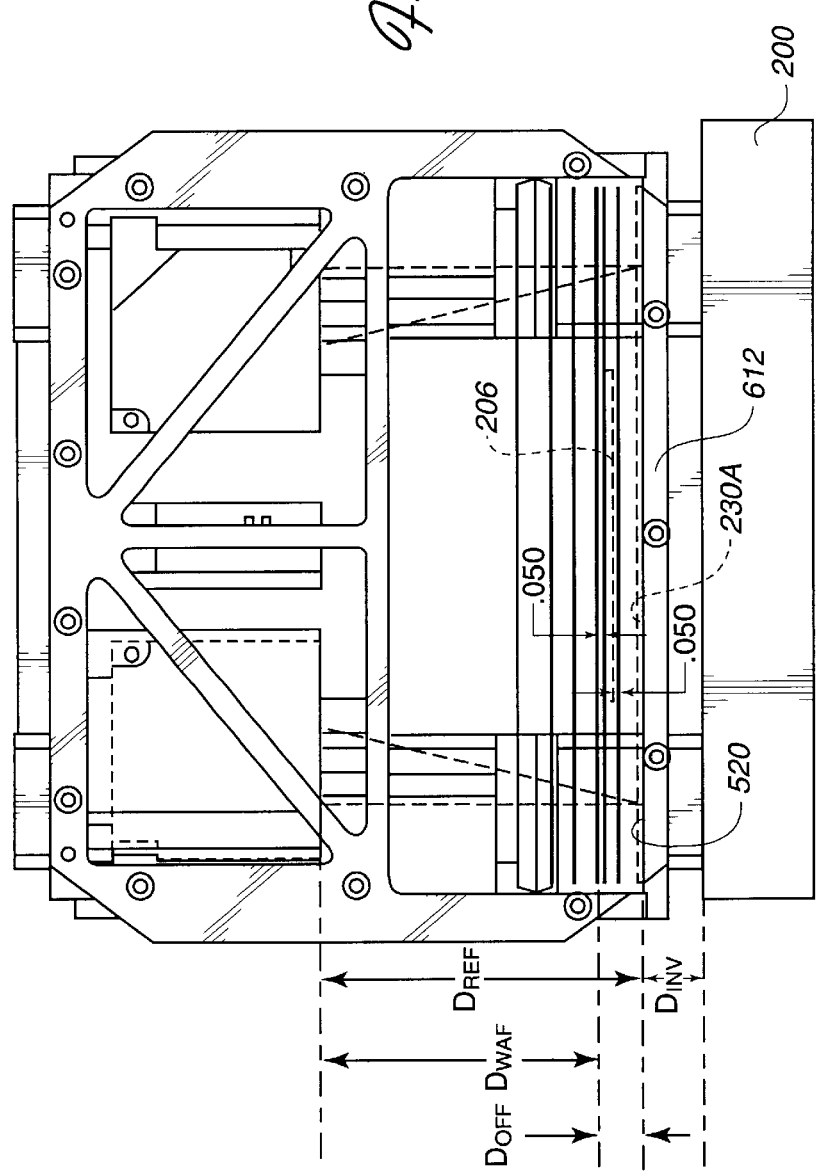
FIG. 14 is a front view of the metrology cassette of FIG. 4, showing the metrology cassette in an inverted position.

In accordance with yet another aspect of the illustrated embodiments, the metrology cassette may be inverted and replaced onto the cassette handler platform to facilitate blade/wafer height measurements at the lower slot number positions. For example, FIG. 14 shows the metrology cassette 410 in the inverted position in which the precision internal reference surface 520 which provides a fixed reference point from which all measurements may be gauged, is fixed adjacent the platform 200, to emulate the bottom of a cassette whereas the laser sensors are spaced from the support in a position at the top of a production cassette. In the illustrated embodiment, the plate 612 and the associated registration surfaces of the metrology cassette 410 are manufactured so that the reference surface 520 is relatively flat and parallel with respect to the base plane 220 of the platform 200 of the cassette handler to a relatively high degree of precision in the inverted position as well the noninverted position depicted in FIG. 5. The distance $D_{INV}$ between the reference surface 520 in the inverted position and the base plane 220 of the platform 200 is known. Again, like the noninverted position, all subsequent distance measurements of the wafer can be made as offsets to this reference surface 520. Thus, the wafer position in a position such as the slot #2 base may be calculated as the difference or offset $D_{OFF}$ between the measured reference distance $D_{REF}$ and the measured wafer distance $D_{WAF}$ as shown in FIG. 14. The wafer offset position $D_{OFF}$ may be converted into a height measurement above the base plane 220 of the platform 200 by adding the known distance $D_{INV}$ to the measured wafer offset position $D_{OFF}$. Such inversion is useful to measure the slot base positions adjacent the support, in those applications in which the distance sensors such as the illustrated laser heads would otherwise interfere with insertion or retraction of the wafer blade.

Because the alignment system can precisely measure the spatial orientation and height of the plane of the wafer, it is appreciated that the measured spatial orientation and height of the plane of the wafer can be compared to any desired spatial orientation and height. The cassette handler or robot blade may then be adjusted until the desired spatial orientation and height of the wafer plane are achieved.

Metrology Cassette 410 Mechanical Construction and Features

The metrology cassette or fixture 410 of the illustrated embodiment is a precision frame assembly emulating the size and mounting interfaces of a wide range of plastic wafer cassettes. The variable attributes of individual cassettes such as slot positions and spacing can be defined in software instead of requiring physical changes to the metrology cassette 410.

As described above, the laser sensors housed within the metrology cassette 410 use the reference surface 520 of the cassette 410 as a "zero" point. In that the height of the reference surface 520 is known, the true height of the wafer may be easily calculated using the measured offset from the reference height. Since this height typically does not appreciably vary with time or temperature (normal extremes), the lasers can be "soft zeroed" using the offset measured from the reference surface 520.

The laser sensors of the illustrated embodiment have a linear measurement range of 3.149"+/−0.7874" (80,00 mm+/−20,00 mm). In the illustrated embodiment, the laser heads are positioned at a height such that the linear measurement range of the laser heads covers slots 1–4 and 22–25 for most styles of cassettes. On some systems, the robot blade wrist may interfere with the top and bottom plates, limiting the mechanically usable slot range for measurement and alignment with tool 410 to slots 2–4 and 22–24. These ranges as well as other sizes, characteristics and values are provided as examples and can vary, depending upon the type of distance sensor selected and the intended application.

The laser head supports on the mounting brackets 512 may be pin-located using dowels or other suitable alignment features, and color coded in their positions, and are preferably not mechanically interchangeable so as to prevent setup errors. The laser heads may be located in a variety of patterns including the illustrated triangular pattern (FIG. 6A) which facilitates height measurement operations or an in-line pattern (FIG. 6B) which facilitates blade characterization. The particular pattern selected may vary depending upon the application.

The mechanical framework of the metrology cassette 410 serves a number of functions in addition to enclosing and supporting the laser sensors. One such function of the fixture is the precise positioning of the reference surface 520 for the laser sensors. It is preferably flat, parallel to the base, and precisely at a defined reference height. In the illustrated embodiment, this reference height of the reference surface 520 is the height marked $D_{NOTINV}$, which is the height of the reference surface above the cassette handler platform base plane 220 when the metrology cassette is in the noninverted position as shown in FIGS. 5 and 8. It is preferred that this dimension be tightly controlled to increase the accuracy of the height measurements. The tolerance specifications for this surface in the illustrated embodiment are as follows:

| | |
|---|---|
| Flatness: | +/−0.002" (+/−0.05 mm) overall |
| Parallelism: | +/−0.002" (+/−0.05 mm) |
| Height $D_{NOTINV}$ (referenced to base plane 220 of platform 200): | $D_{NOTINV}$ +/−0.002" (181.04 mm +/− 0.05 mm) |

As set forth above, another preferred construction feature is the thickness of the upper reference plate 612 from its topmost surface in the noninverted orientation to the reference surface 520. This thickness defines another reference height of the reference surface 520. This second reference height is the height marked $D_{INV}$, which is the height of the reference surface 520 above the cassette handler platform base plane 220 when the metrology cassette is in the inverted position as shown in FIG. 14. Its specification in the illustrated embodiment is:

Thickness: $D_{INV}$+/−0.002" (+/−0,05 mm)

Adding the two reference heights to one another, the overall height of the metrology cassette 410 is:

Total Height: $D_{INV}$+$D_{NOTINV}$+/−0.004" (+/−0,10 mm)

Furthermore, the finish of the reference surface 420 is preferably compatible with the laser sensors. In the illustrated embodiment, the reference surface 520 is lapped, ground and "vapor honed" to a matte finish (0.0000" (0,00041 mm) RMS) to within +/−0.001" (+/−0,0255 mm) flatness across its entire working surface. The reference surface is also hard anodized to deposit a layer which provides a surface which is similar to a white unglazed ceramic.

FIG. 12a shows a top view of the top plate 612 of the metrology cassette. The top plate 612 has base plane surfaces which engage the base plane 220 of the cassette handler platform 200. Those cassette base plane surfaces and other topmost surface features of the top plate are preferably themselves flat within 0.002" (0,05 mm) for the fixture 410 to fit into the system's cassette handler nest in the cassette noninverted position without rocking. These features also may have tight tolerances applied to them so that the assembly will not have excessive lateral movements during its use. The cassette base plane surfaces and other surface features of the base plate 630 may be similarly constructed to facilitate fitting into the system's cassette handler nest in the cassette noninverted position.

As best seen in FIGS. 5 and 6, the metrology cassette 410 has side rails 570 which support and locate the reference plate 612. In addition the side rails 570 maintain the "squareness" of the shape of the metrology cassette. A webbing 572 (FIG. 8) in the front (wafer entry side) of the fixture 410 is provided to increase its stability and strength. These pieces also serve as registration surfaces for systems such as the P5000 Ergonomic Cassette Handler (sold by Applied Materials, Inc.) that rely upon certain upper-portion features for location.

In the illustrated embodiment the components of the fixture 410 are preferably located and assembled with dowel pins 580 to ensure that the basic accuracy of the fixture is not compromised under normal operating conditions. The top surface of the plate 612 and the bottom surface of the base plate 630 are both machined to imitate the bottom features of common wafer cassettes. Thus, the exterior of the metrology cassettes emulates the bottom surface features, wafer cassette vertical profile, sidebars, "H" bar, et cetera. This allows it to be inserted into most systems with the reference plate on top or bottom. This is very useful when characterizing leadscrews and determining slot spacing. In addition, this widens the applicability of the fixture because it allows upper and lower slot alignments to be performed. It also allows topside and bottom side rotations and extensions to be determined. These features include the H-bar 622 as shown in FIG. 12a. Variations and compromises from the features of individual cassettes can be made so as to accommodate the widest possible range of systems and cassettes. For example, by choosing the smallest size of the registration surfaces within the permitted range of tolerances of the cassettes to be emulated, the number of cassettes which can be emulated by a single tool 410 may be increased.

The metrology cassette 410 of the illustrated embodiment is lightweight, preferably approximating the mass of a production wafer cassette full of wafers. It should be noted that the precise location of the fixture in the horizontal plane (X-Y) is significant primarily in the extension/rotation alignment setups because the plate 612 contains the precision alignment hole 600 for extension and rotation determinations.

The dimensions, ranges, shapes, materials, sizes, characteristics, finishes, processes and values of the metrology cassette construction are provided as examples and can vary, depending upon the intended application.

Robot Blade Alignment Tool System

Figure 15:
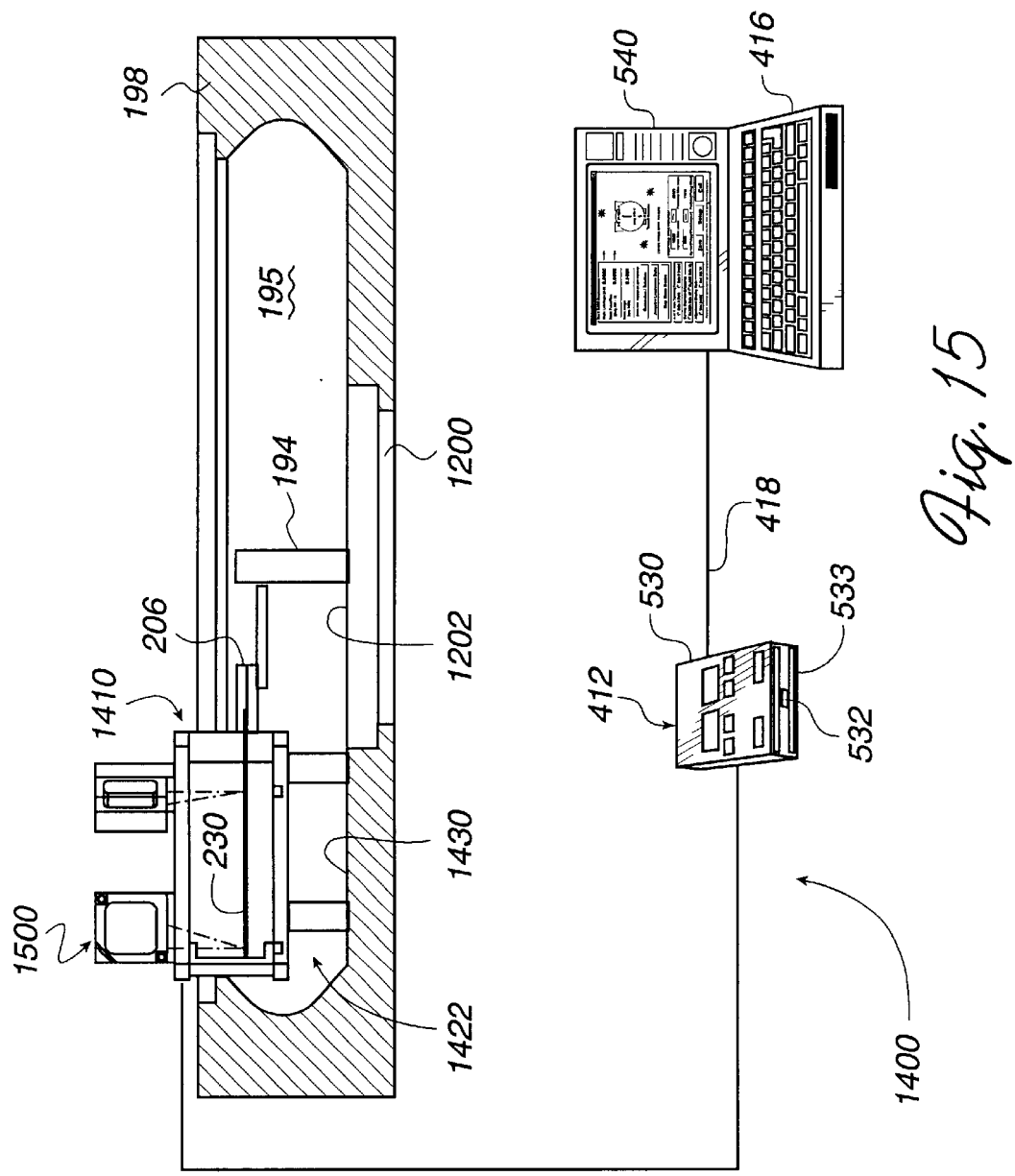
FIG. 15 is a schematic pictorial view of a robot blade alignment tool system in accordance with an alternative embodiment of the present inventions.
Figure 16:
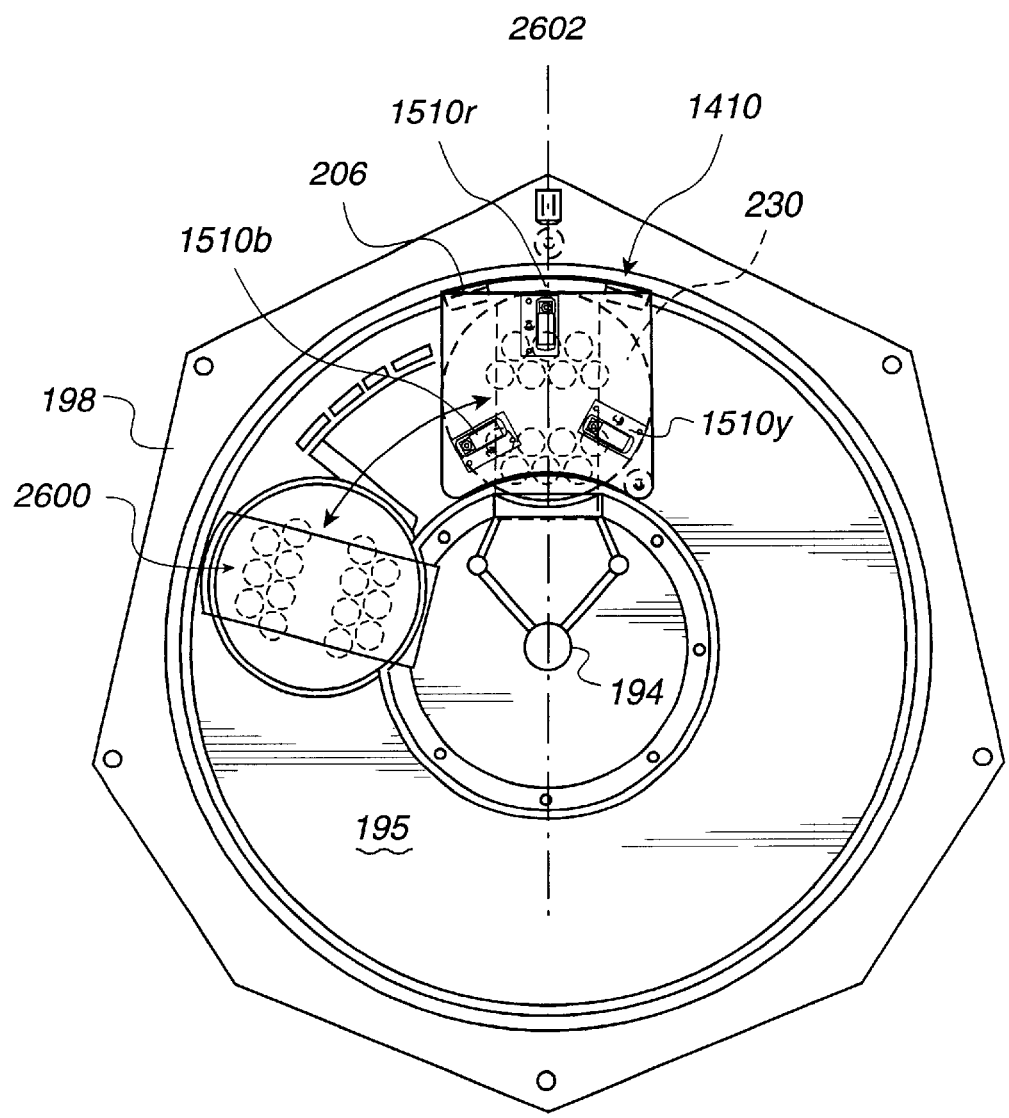
FIG. 16 is a top view of the transfer chamber of FIG. 1 with the blade alignment tool of FIG. 15 disposed in the chamber.

An alignment tool in accordance with the present invention may be used for applications other than leveling a cassette handler. FIGS. 15 and 16 show an example of an alternative embodiment in which a robot blade alignment tool system 1400 is used to measure the levelness of a workpiece 230 carried on a robot blade 206 in the transfer chamber 195 of the mainframe 198. The robot blade alignment tool system 1400 comprises a metrology tool 1410, tool controller 412 coupled by communication cables 414 to the metrology tool 1410, and a computer 416 coupled by a communication cable 418 to the tool controller 412. The tool controller 412 and the computer 416 may be the same or substantially the same as the controller 412 and computer 416 of the cassette tool system embodiment.

The metrology tool 1410 includes a base 1422 which supports the tool 1410 on a floor surface 1430 of the transfer chamber 195. The floor surface 1430 defines a base plane in a manner similar to that of the base plane 220 of the platform of the cassette handler of FIG. 2. Accordingly, the floor surface 1430 of the chamber 195 may be thought of as a platform for the metrology tool 1410.

The robot blade alignment tool system 1400 may be used with processing systems having one or many processing chambers and one or more workpiece handling systems for transferring workpieces through one or more buffer, transfer or pass-through chambers, to one or more of the processing chambers. Once the robot blade has been properly aligned for one chamber, the metrology tool 1410 may be removed from the chamber and processing of workpieces may begin. However, it is preferred that all the robot blades be aligned with respect to the appropriate chambers prior to initiating processing of production workpieces.

Like that of the metrology cassette 410, the metrology tool 1410 has a distance measurement device 1500 which can provide precise measurements of the position of a wafer or other workpiece being held by the robot blade within the metrology tool 1410. As explained in greater detail below, these wafer position measurements can be used to accurately align a robot blade relative to the chamber in such a manner as to reduce or eliminate accidental contact between the blade or the wafer held by the blade and the walls or apparatus within the chambers.

Figure 17:
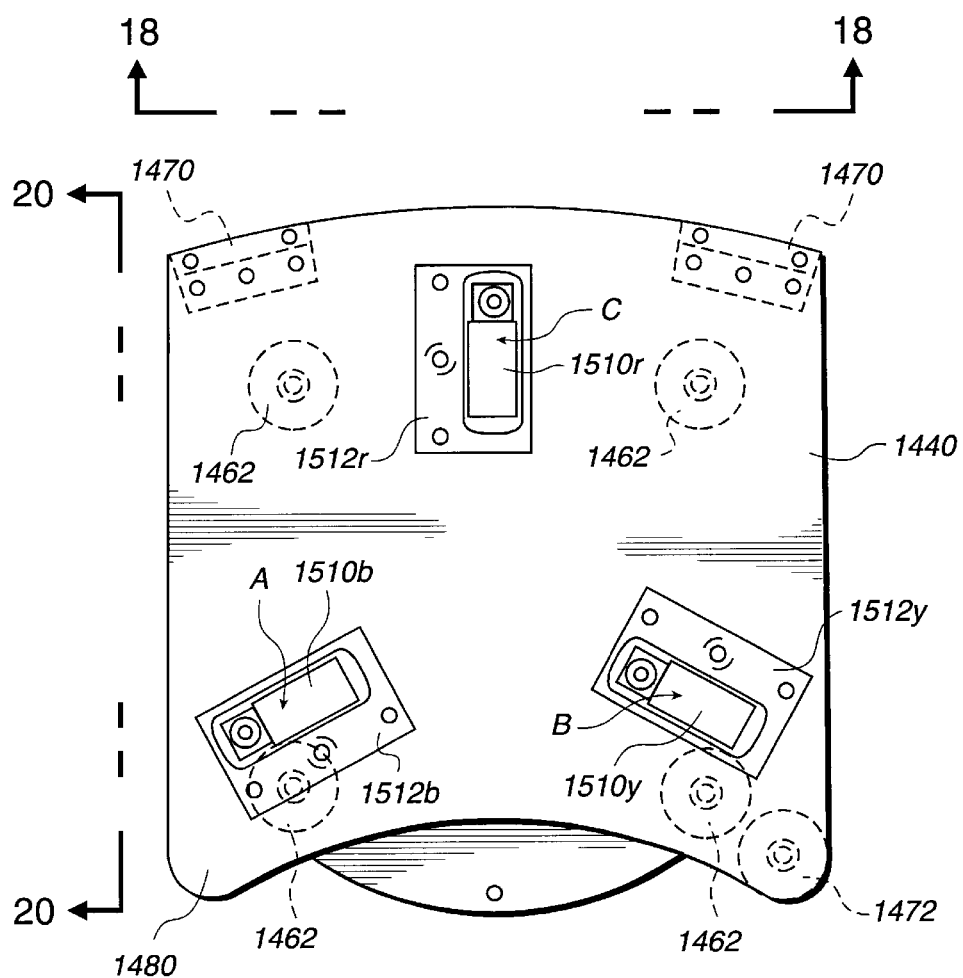
FIG. 17 is a top view of the metrology tool of FIG. 15.
Figure 18:
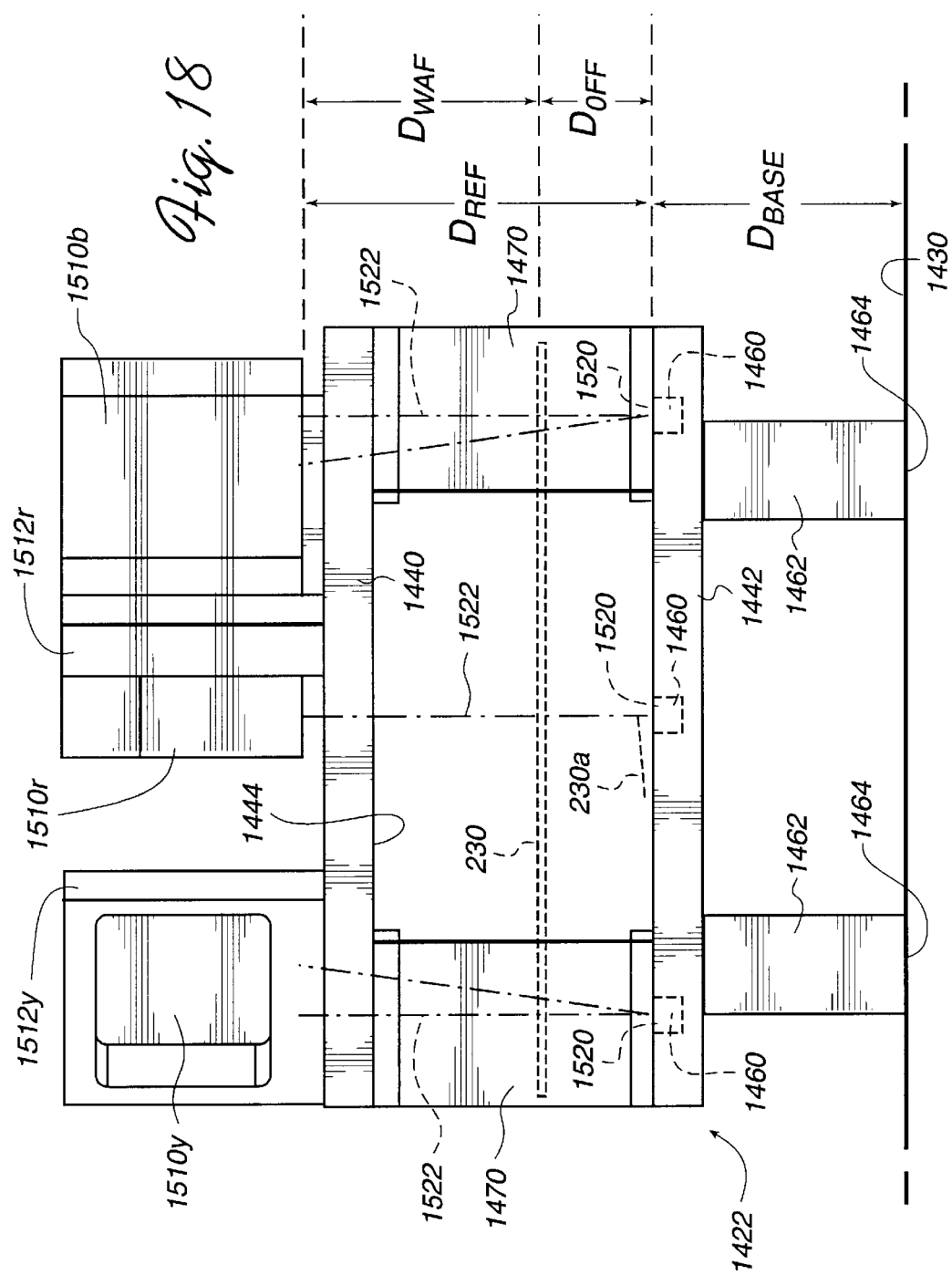
FIG. 18 is a rear view of the metrology tool of FIG. 15.
Figure 20:
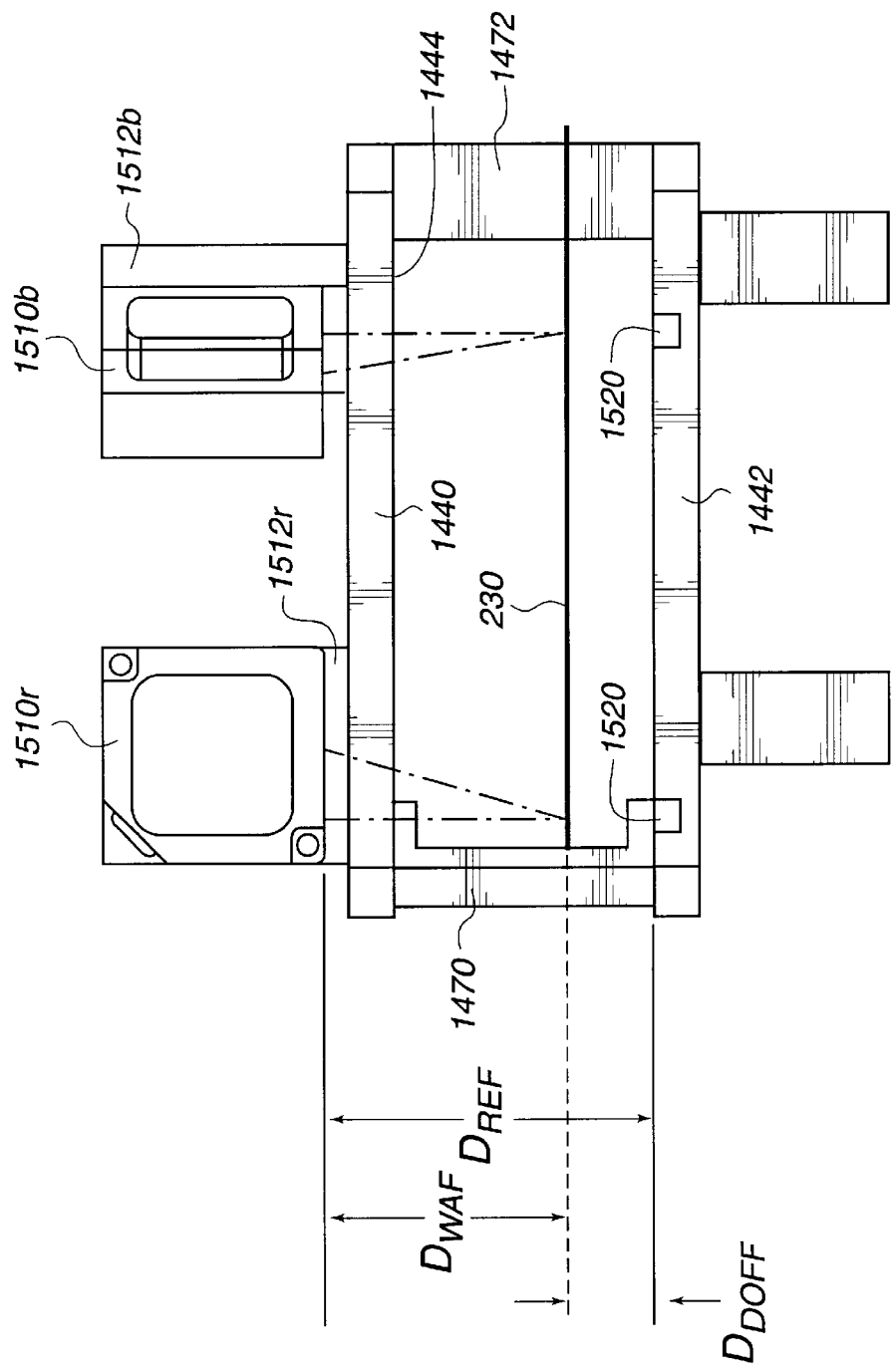
FIG. 20 is a side view of the metrology tool of FIG. 15.

As best seen in FIGS. 17, 18, and 20 in the illustrated embodiment, the distance measurement device 1500 of the illustrated embodiment includes three laser sensors A, B and C, each of which includes a laser head 1510b, 1510r or 1510y, which is clamped in a sensor mount or mounting 1512b, 1512r or 1512y, respectively, carried by the metrology tool 1410. Like the mountings of the metrology cassette, the mountings 1512b, 1512r and 1512y are preferably color coded and mechanically keyed to reduce or eliminate inadvertent exchanges or misplacements of the laser heads in the mountings. Thus, the mountings 1512b, 1512r and 1512y may be color coded blue, red and yellow, respectively, for example. In the illustrated embodiment, the mountings are brackets but may have a variety of other mechanical shapes, depending upon the particular application.

In the illustrated embodiment, the distance sensors are the same as the laser sensors of the metrology cassette 410. Similarly, it is appreciated that other types and numbers of distance measuring sensors may be used.

In the embodiment of FIG. 17 the heads 1510b, 1510r and 1510y of the laser sensors are positioned in an equilateral triangular placement which facilitates a three point plane distance determination for measuring the plane position and orientation of a surface such as a wafer surface. In a manner similar to that of the metrology cassette explained above, the laser heads may be readily repositioned to other placements including an in-line placement for blade motion mapping, and a modified right triangle placement for on-blade measurements.

Tool Sensor Calibration

The metrology tool 1410, like the metrology cassette 410, includes precision internal reference surfaces which define a reference plane 1520 (FIG. 18) which provides fixed reference points from which all measurements may be gauged. The surfaces which define the reference plane 1520 are fixed at the top of the base 1422 whereas the laser sensors are fixed to the top of the tool 1410. The laser sensor light beams 1522 are intercepted by the reference surface 1520 when no wafer is present inside the metrology tool 1410 and are reflected by the surface 1520 back to the laser heads of the laser sensor.

In the illustrated embodiment, the metrology tool 1410 is manufactured so that the reference surfaces 1520 are relatively flat and parallel with respect to the base plane 1430 of the chamber floor to a relatively high degree of precision. All subsequent distance measurements of the wafer can be made as offsets to this reference plane 1520. As previously noted, because of the effects of temperature and aging of electronics, the output of the laser sensors can often vary over time. Thus, the actual value of the laser measurements of the distance $D_{REF}$ between the laser sensors and the reference plane 1520 can also vary over time even though the actual distance remains fixed. However, because all subsequent distance measurements of the wafer are made as offsets to this reference plane 1520, whatever value the lasers determine the distance $D_{REF}$ between the laser sensors and the reference plane 1520 to be, that value is considered to be the "zero" distance. Any subsequent measurement of wafer position is calculated as the difference or offset $D_{OFF}$ between the measured reference distance $D_{REF}$ and the measured wafer distance $D_{WAF}$. Hence, calibrating the laser sensors is simply a matter of turning the laser sensors on and after a sufficient warm up time, noting the measured reference distance $D_{REF}$ and assigning that value as the "zero" distance as described above in connection with the metrology cassette 410.

Thus, once the laser heads are warmed up, the operator may "zero", or calibrate the alignment tool system 1400 by pressing the button 532 on the interface controller 412, which is labeled "ZERO". In response, the system assigns the three distance values measured by the three laser heads to be the distance $D_{REF}$ between that laser sensor and the reference plane 1520 for each laser head. In that this distance value for each laser is the "zero" distance, the displayed measurement values for each laser head, labeled "blue", "yellow" and "red", are set to indicate 0.000 as shown in FIG. 7. Calibration of the laser sensors is thus completed in a simple manner without requiring any external instruments or tools.

Figure 19:
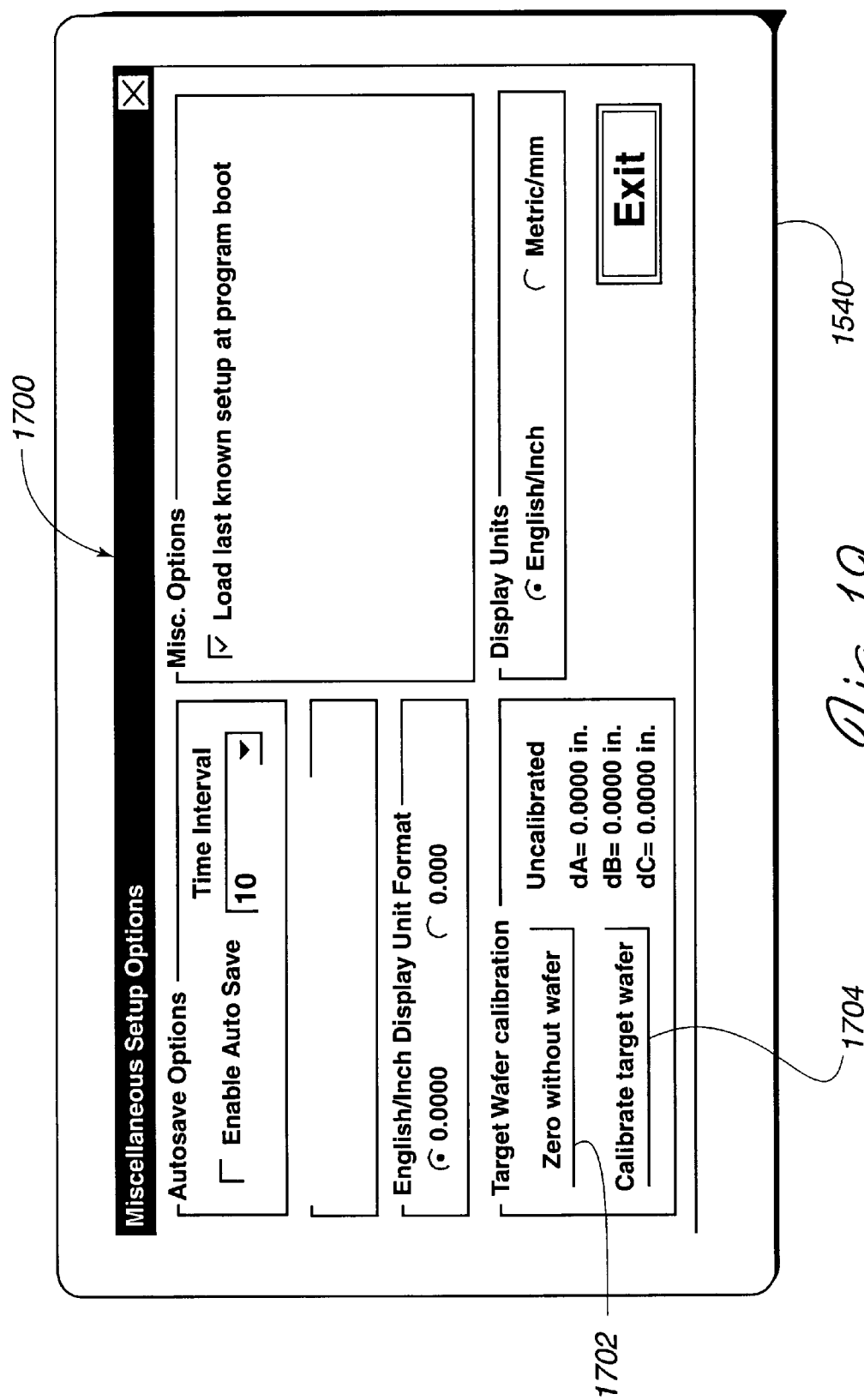
FIG. 19 is a view of the computer display of FIG. 15, depicting an input-output screen used in a calibration procedure.

FIG. 19 shows an example of an input-output screen 1700 of a graphical user interface of the display 1540 of the computer 416 that may also be used to calibrate the distance sensors. The screen 1700 has a "button" 1702 labeled "zero without wafer" which may be activated by the operator moving the display cursor over the button 1702 and depressing the appropriate mouse or other input device button. Again, in response, the system assigns the three distance values measured by the three laser heads to be the distance $D_{REF}$ between that laser sensor and the reference plane 1520 for each laser head. The three distance values dA, dB and dC for the three laser heads A, B and C, respectively, are each assigned an output value of 0.0000 inches as shown in the screen of FIG. 19.

Although the reference plane 1520 of the metrology tool 1410 of the illustrated embodiment is described as being flat and parallel, it is appreciated that other shapes and orientations of reference surfaces and points may be used, depending upon the application. It is further appreciated that the distance sensors such as the laser sensors illustrated may be calibrated in other techniques such that the reference surface may be eliminated in some embodiments. For example, the sensors may be periodically calibrated using external reference surfaces or may be calibrated electronically. Also, the computer 416 is illustrated as a standard "laptop" size computer. A variety of computing devices may be used including workstations and dedicated processors.

Workpiece Target Surface Calibration

As discussed above, it is recognized that targets being sensed by distance sensors may respond to the distance sensors in different manners. For example, the infrared portion of the radiation from the laser sensors is typically not reflected by the outermost exterior surface of a silicon wafer but is usually reflected at an internal depth within the silicon wafer. By comparison, each reference surface 1520 of the illustrated embodiment has a treated surface which preferably reflects the sensor beam more closely from the actual exterior of the reference surface.

Because the reference surface and the workpiece may respond differently to the sensor beams from the sensors, an error or deviation may be introduced into the measurements of the true distances. The responsiveness of the target surface of the workpiece and the target surface of the reference plane 1520 may be measured and compared to determine any such difference which may be expressed as a correction factor. This correction factor may then be applied to distance measurements of the target workpiece to compensate for the manner in which the target workpiece responds to the sensor beams and thereby reduce or eliminate any such error caused by such differences.

To determine the correction factor, the distance sensors are first calibrated in the manner discussed above with no wafer present in the metrology cassette. Thus, the "button" 1702 (FIG. 19) labeled "zero without wafer" of the screen 1700 may be activated by the operator moving the display cursor over the button 1702 and depressing the appropriate mouse or other input device button. Accordingly, the laser beams emitted by the laser sensors and reflected by the reference plane 1520 are sensed to provide the reference distances $D_{REF}$ to the reference plane for each laser head.

A wafer may be conveniently positioned on and supported by the metrology reference plane 1520. In this position, the laser sensing beams are reflected by the wafer rather than the reference plane 1520. If the laser beams are reflected by the exterior surface of the wafer, the distance measurement $D_{TGT}$ to the target would change by the thickness $W_{THICK}$ of the wafer. However, because silicon wafers have a degree of transparency to infrared radiation, the measurement of the distance from the sensors to the wafer provides a measurement value $D_{TGT}$ which differs from the previously measured reference distance $D_{REF}$ to the reference plane 1520 by a value which is less than the thickness of the wafer as shown in FIG. 13 in connection with the laser head 510r and reference plane 520. By comparing this difference value $(D_{REF}-D_{TGT})$ to the known thickness $W_{THICK}$ of the wafer 230a, the correction factor $F_{COR}$ may be calculated as $F_{COR}=W_{THICK}-(D_{REF}-D_{TGT})$. Thus, upon activating a "calibrate target wafer" button 1704 (FIG. 19), the distance $D_{TGT}$ from the sensors to the wafer is noted for each laser head such as laser head 1510r and used with the previously measured reference distance $D_{REF}$ to the reference plane 1520 and the known wafer thickness $W_{THICK}$ to calculate the correction factor $F_{COR}$ for each laser head. Subsequent measurements of the distance to the wafer may then be corrected by subtracting the correction factor $F_{COR}$ from the measured distance value $D_{TGT}$ to provide the corrected distance $D_{WAF}$ which is a more accurate representation of the distance from a laser head sensor to the outer surface of the wafer.

The tool of the illustrated embodiment may be used with a variety of target workpieces. Because the response of a target such as a silicon wafer to a distance sensor such as a laser sensor may vary from wafer to wafer, it is preferred that the same wafer be used for subsequent aligning and calibration procedures discussed below. It should also be appreciated that correction factors may be determined for other types of targets and sensors, correcting for the variations in the manner in which particular targets respond to particular sensors. The target wafer of the illustrated embodiment is a standard unprocessed silicon wafer in which the back side is directed toward the sensors. Other types of targets may be used including ceramic wafers.

Robot Blade Leveling

In aligning a robot blade to a chamber, it is preferred that the wafer held by the robot blade be as parallel as possible to any horizontal surface of the chamber to which the wafer may come near. These horizontal surfaces include the slit passageways of the chamber. Accordingly, system robots typically have various adjustment mechanisms on the mounting platform 1200 (FIG. 15) of system robot 194 which adjusts the tilt of the system robot 194 so that the wafer 230 and thus the robot blade 206 on which the wafer rests, are oriented parallel to the horizontal reference surfaces of the chamber. These adjustments, which may include forward/backward and left/right adjustments, for example, are typically referred to as "leveling" the robot blade although achieving a true horizontal leveling is typically not the goal.

As explained below, an alignment tool system 1400 in accordance with a preferred embodiment of the present invention readily permits the robot blade to be "leveled" relative to the chamber both quickly and very accurately. Instead of relying upon visual estimates or the mechanical contact tools of prior methods, the alignment tool system 1400 of the illustrated embodiments accurately measures the plane of the wafer or other target to determine the left/right and forward/back displacements of a robot blade carrying a wafer relative to the reference plane 1520 of the metrology tool 1410 and provides a numerical output indicating both the direction and amount of each displacement. Using this information, the operator can readily adjust the robot blade until the system 1400 indicates that the amount of left/right and front/back displacements are zero or within tolerance.

The following provides an example of such a robot blade leveling operation for the transfer chamber 195. In this example, the chamber floor surface 1430 supporting the alignment tool 1410, is parallel to the mounting surface 1202 of the mounting platform 1200 of the system robot 194. The base 1422 of the alignment tool 1410 precisely supports the reference plane 1520 of the tool 1410 parallel to the base plane 1430 and hence parallel to the mounting surface 1202 of the system robot mounting platform 1200. Thus, the alignment system 1400 in measuring the orientation of the wafer 230 held by the robot blade 206, can in effect measure the orientation of the wafer 230 relative to the mounting surface 1202 of the system robot mounting platform. The measurement outputs, either numerical or graphical, may be used to indicate the appropriate adjustments to the robot blade orientation to achieve the desired robot blade orientation as follows. In addition to a transfer chamber, a metrology tool in accordance with the present invention is adaptable for use with a variety of chambers that house a robot or otherwise establish a robot datum plane such as the base plane 1430 for purposes of aligning a robot. First, the operator places a ceramic or clean silicon target wafer or other target in the blade pocket. A silicon target wafer should be placed with the dull silver side up to face the laser sensors. The dull silver side of the wafer defines a plane, the spatial orientation of which will be measured by the sensors. The robot blade is then rotated (i.e. swings or orbits around the central axis of the transfer chamber) to the position as indicated at 2600 in FIG. 16, with the wafer properly in the robot blade pocket. In the illustrated embodiment, the position of the robot blade is referred to as the chamber "C" rotation position with a zero extension of the blade. The metrology tool 1410 of the alignment tool 1410 is then placed on the floor surface 1430 of the transfer chamber as shown in FIGS. 15 and 16.

The alignment tool system 1400 may be calibrated by pushing the Zero button on the alignment tool system controller 412 as described above to ensure that "L/R" and "F/B" displayed values on the interface controller display 530 are both reading 0.0000 as shown in FIG. 7. The L/R displayed value is the difference between the distance measurements of the blue and yellow laser heads 1510b and 1510y, respectively, which are disposed on the left and right, respectively as shown in FIG. 17. The F/B reading is the difference between the averaged distance measurement of the blue and yellow laser heads 1510b and 1510y, respectively, which are disposed in the front of the metrology tool 1410, and the red laser head 1510r which is disposed in the back of the metrology tool 1410 as shown in FIG. 17. Because the robot blade and wafer have not yet been rotated into the metrology tool 1410, the light beams of the laser distance sensors will intercept the reference plane 1520. As previously mentioned, the distance measurements of the three lasers to the flat, parallel reference plane 1520 during the "zeroing" operation are calibrated to be output as zero. Thus, the difference between the left and right laser distance measurements is assigned an L/R output of zero and the difference between the front and back laser distance measurements is assigned an F/B output of zero.

Following calibration of the lasers, the robot blade and wafer may be rotated or swung into the metrology tool 1410, as shown in FIG. 15 and indicated at 2602 in FIG. 16, preferably making sure there is no contact from the robot blade and wafer with any part of the metrology tool 1410.

The robot blade and wafer may be stopped at the "calibration" position which is the position at which the blade is preferably centered with the metrology tool 1410. Transfer robot movements are typically commanded through a processing system controller.

After the robot blade is rotated into the metrology tool 1410, the distance $D_{WAF}$ (FIG. 18) from each laser sensor to the planar top surface of the wafer on the robot blade is measured by the three sensors as shown in FIG. 20. After allowing a few seconds for the reading on the interface controller display 530 to stabilize, the outputs labeled "L/R" and "F/B" may be noted. The offset distances $D_{OFF}$ from the reference plane 1520 to the wafer ($D_{REF}$–$D_{WAF}$) may then be displayed for each laser head as shown in FIG. 11. These three measurements precisely define the spatial orientation and distance of the wafer plane relative to the reference plane 1520. In the example of FIG. 11, the offset distance $D_{OFF}$ for each laser sensor is displayed as 1.333, which will be the same for each sensor if the robot blade is properly leveled relative to the tool reference plane 1520. The L/R displayed value is the difference between the distance measurements of the blue and yellow laser heads 1510b and 1510y, respectively, which are disposed on the left and right, respectively, as shown in FIG. 17. Thus, the L/R displayed value will be 0.0000 if the robot blade is leveled in the left-right direction. Similarly, because the F/B reading is the difference between the averaged distance measurement of the blue and yellow laser heads 1510b and 1510y, respectively, which are disposed in the front of the metrology tool 1410, and the red laser head 1510r which is disposed in the back of the metrology tool 1410 as shown in FIG. 17, the F/B displayed value will be 0.0000 if the blade is leveled in the front-back direction. Thus, if the robot blade is leveled to the chamber both readings will be 0.0000. If not, the robot blade will need to be leveled relative to the chamber.

The mounting platform adjustment mechanism of the illustrated embodiment may be adjusted to change the front/back and left/right orientation of the platform 200, and thus the orientation of the robot blade to the tool 1410 and hence the chamber. The particular manner and directions of adjustment may depend upon the particular robot mount adjustment mechanism. The adjustment mechanism is graphically represented in a convenient computer display output 2100 shown in FIG. 21.

The following provides an example of use of a robot blade alignment tool in accordance with an embodiment of the present invention for leveling a robot blade. Of course, the procedure may be readily modified to accommodate the particular leveling adjustment mechanism of the particular robot being used.

First, the operator levels the robot blade in the front to back (F/B) direction, allowing the F/B measurement displayed by the interface controller display 530 (FIG. 11) to stabilize after the change. If the F/B reading becomes a smaller value (closer to the 0.000), the operator should continue to adjust the mount in the front to back direction until the F/B indicator becomes 0.000 or within tolerance. If the display F/B value becomes larger, the operator can reverse the adjustment. It is preferred that the operator make small adjustments, waiting for the display reading to stabilize before making the next adjustment. Next, the robot mount may be leveled in another direction using the same method of adjustment described above. In the illustrated embodiment, the second direction is in the left to right (L/R) direction which is orthogonal to the front to back direction. When both of the F/B and L/R readings are 0.0000 or within tolerance such as 0.0020, for example, the robot blade is level to the transfer or robot housing chamber.

The plane of the wafer may be adjusted to achieve other spatial orientations and heights relative to the chamber. Because the alignment system can precisely measure the spatial orientation and height of the plane of the wafer, it is appreciated that the measured spatial orientation and height of the plane of the wafer can be compared to any desired spatial orientation and height. The robot blade mount adjustment mechanism may then be adjusted until the desired spatial orientation and height of the wafer plane are achieved relative to the chamber. In addition, the movement of the wafer may be mapped as the robot blade is moved to detect and correct deviations in that movement, as described in the aforementioned copending application Ser. No. 09/294,301.

Figure 21:
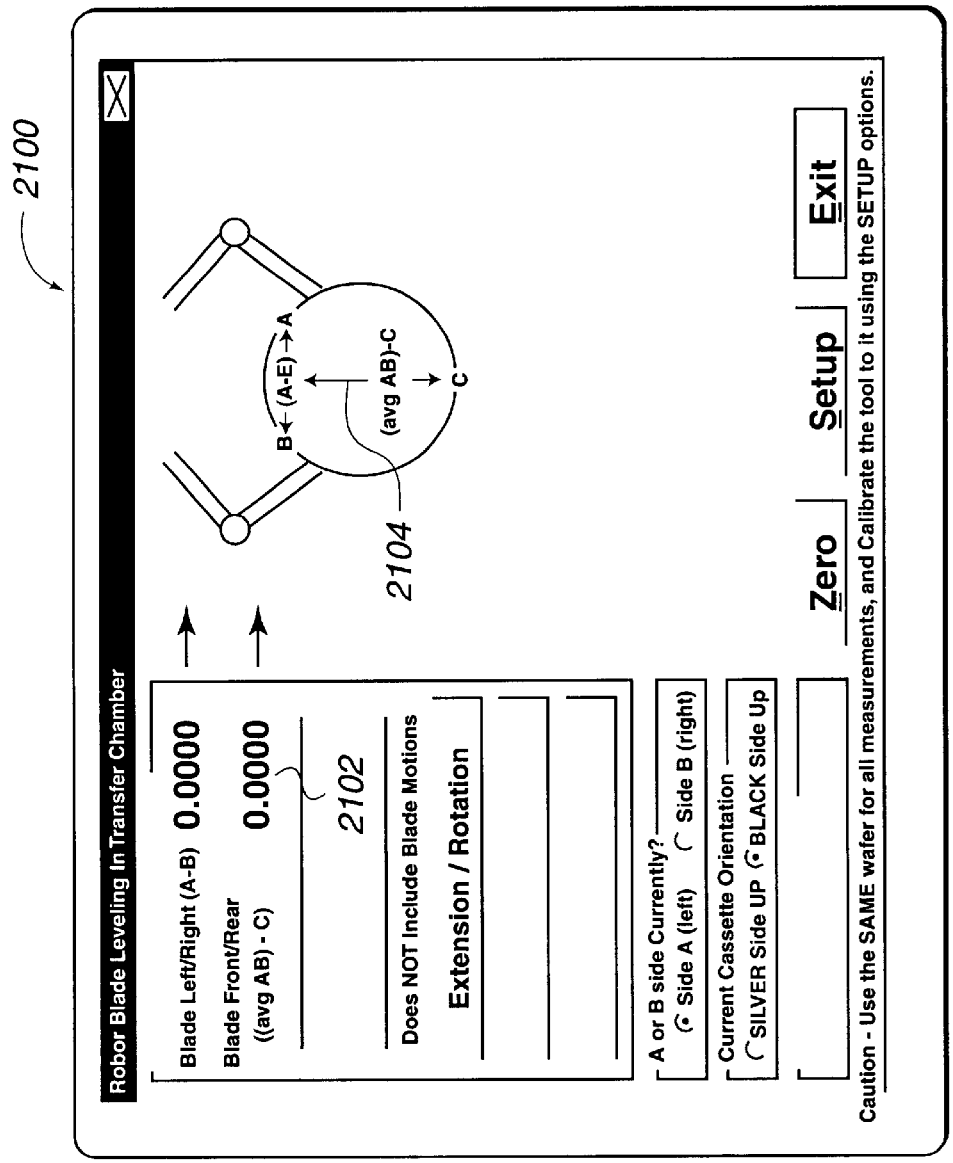
FIG. 21 is a view of the computer display of FIG. 15, depicting an input-output screen used in a leveling procedure.

FIG. 21 shows the computer display screen 2100 having an output labeled "Blade Left/Right (A–B)" which is similar to the L/R output of the interface controller display discussed above. However, the displayed value "A–B" is the difference between the two displacements, one measured by the blue (left) laser 1510b and one measured by the yellow (right) laser 1510y, from the calculated wafer position relative to the chamber. In the illustrated embodiment, the robot mount has a mechanism for adjusting the orientation of the robot blade along the left/right direction, wherein the blue (left) laser 1510b and the yellow (right) laser 1510y are disposed along a line parallel to the left/right direction as shown in FIGS. 17 and 21. The amount and direction of adjustment may also be numerically and/or graphically represented as shown in the numerical outputs 2102 and graphical outputs 2104 of the computer user interface 2100 of FIG. 21.

Another output of FIG. 21 labeled "Blade Front Rear (avg AB)–C)" is similar to the F/B output of the interface controller display but the value "C" is the displacement measured by the red (back) laser 1510r, from the calculated preferred wafer position. If robot blade is in the desired position relative to the transfer chamber, both readings will be 0.0000 because the displacements from the preferred position will be zero for each laser, indicating a level condition. If not, the operator can level the robot blade in the same manner described above, adjusting the mount until the desired 0.0000 readings (or within tolerance) are obtained. In another embodiment, the robot mount has a mechanism for adjusting the orientation of the robot blade along the front/back direction, wherein a front laser and a back laser are disposed along a line parallel to the front/back adjustment direction in a manner similar to that depicted for the cassette metrology tool shown in FIG. 6c.

Metrology Tool 1410 Mechanical Construction and Features

The metrology tool or fixture 1410 of the illustrated embodiment is a precision frame assembly. As described above, the laser sensors housed within the metrology tool 1410 use the reference plane 1520 of the tool 1410 as a "zero" point. In that the height $D_{BASE}$ (FIG. 18) of the reference plane 1520 above the base plane 1430 is known, the true height of the wafer may be easily calculated using the measured offset from the reference height. Since this base height typically does not appreciably vary with time or temperature (normal extremes), the lasers can be "soft zeroed" using the offset measured from the reference plane 1520.

The laser sensors of the illustrated embodiment have a linear measurement range of 3.149"+/−0.7874" (80,00 mm+/−20,00 mm). In the illustrated embodiment, the laser sensors are supported by a top plate 1440 and the reference surfaces 1520 are supported by a bottom plate 1442 such that the reference surfaces 1520 are within range of the laser sensors. The metrology tool 1410 defines an opening 1444 which is positioned within the range of the laser sensor and is sufficiently tall to admit the robot blade and a wafer carried by the blade. These ranges as well as other sizes, characteristics and values are provided as examples and can vary, depending upon the type of distance sensor selected and the intended application.

The laser head supports on the mounting brackets 1512 may be pin-located and color coded in their positions, and are preferably not mechanically interchangeable so as to prevent setup errors. The laser heads may be located in a variety of patterns on the top plate 1440 including the illustrated triangular pattern (FIG. 17) which facilitates height measurement operations or an in-line pattern which facilitates blade characterization. The particular pattern selected may vary depending upon the application.

The mechanical framework of the metrology tool 1410 serves a number of functions in addition to enclosing and supporting the laser sensors. One such function of the fixture is the precise positioning of the reference plane 1520 for the laser sensors. In the illustrated embodiment, the reference plane is defined by the top surfaces of three disk-shaped buttons 1460 received in the bottom plate 1442 which is supported by four legs 1462 which have support surfaces 1464 engaging the floor 1430 of the transfer chamber. The reference plane 1520 is preferably flat, parallel to the base, and precisely at a defined reference height. In the illustrated embodiment, this reference height of the reference plane 1520 is the height marked $D_{BASE}$ which is the height of the reference plane 1520 above the base plane defined by the floor 1430 when the metrology tool is placed in the chamber as shown in FIG. 18. It is preferred that this dimension be tightly controlled to increase the accuracy of the height and distance measurements. The tolerance specifications for this surface in the illustrated embodiment are as follows:

| | |
|---|---|
| Flatness: | +/−0.002" (+/−0.05 mm) overall |
| Parallelism: | +/−0.002" (+/−0.05 mm) |
| Height $D_{BASE}$ (referenced to base plane 1430 of platform 200): | $D_{BASE}$ +/−0.002" (181.04 mm +/− 0.05 mm) |

Furthermore, the finish of the reference subsurfaces 1520 on the top of the buttons 1460 is preferably compatible with the laser sensors. In the illustrated embodiment, the reference surface 1520 is lapped, ground and "vapor honed" to a matte finish (0.000016" (0,00041 mm) RMS) to within +/−0.001" (+/−0,0255 mm) flatness across its entire working surface. The reference surface is also hard anodized to deposit a layer which provides a surface which is similar to a white unglazed ceramic.

The support surfaces 1464 of the legs 1462 of the base 1422 are preferably themselves flat within 0.002" (0.05 mm) for the metrology tool 1410 to rest on the chamber floor without rocking. These features also may have tight tolerances applied to them so that the assembly will not have excessive movements during its use.

As best seen in FIGS. 17, 18 and 20, the metrology tool 1410 has two rear brackets 1470 and a front post 1472 which support and locate the top and bottom plates 1440 and 1442. In addition the rear brackets 1470 and front post 1472 maintain the "squareness" of the shape of the metrology tool. One front corner 1480 (FIG. 17) lacks a front post to permit the robot blade and wafer to rotate or swing into the opening 1444 defined by the metrology tool without striking any of the structure.

In the illustrated embodiment the components of the metrology tool 1410 are preferably located and assembled with dowel pins to ensure that the basic accuracy of the fixture is not compromised under normal operating conditions. The dimensions, ranges, shapes, materials, sizes, characteristics, finishes, processes and values of the metrology tool construction are provided as examples and can vary, depending upon the intended application.

Interface controller 412 Construction and Features

The interface controller 412 of the illustrated embodiment serves multiple functions in the alignment tool systems 400 and 1400. Among other things, it acts as a power conditioning and distribution center, a signal conditioner and converter, display, communications driver, and operator interface. Thus, the computer generated graphical interface may be eliminated in some applications.

Figure 22:
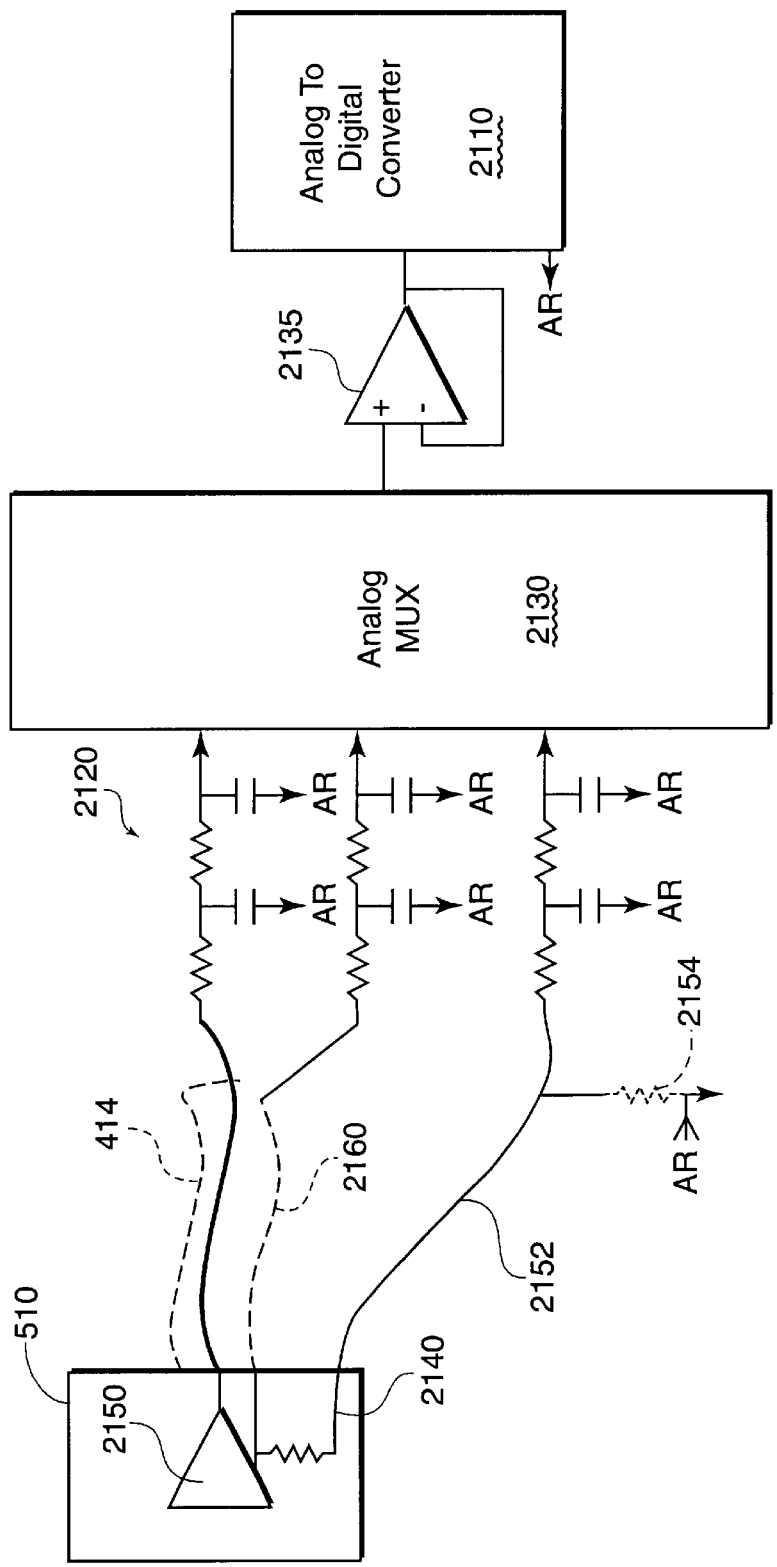
FIG. 22 is a schematic diagram of the interface controller signal processing circuit for sampling signals from the laser head sensors.

Outputs from the laser sensors range from −5.0000 to +5.0000 volts. This voltage range corresponds to the limits of the linear measurement range, as previously mentioned. An internal high-precision analog-to-digital converter 2110 (FIG. 22) is used to change the incoming voltage level into a signed binary number which is then converted to Inch or Metric readings for display or transmission. The display conversion range in the illustrated embodiment is −1.5745" (−40,00 mm) to +1.5745" (+40,00 mm), which represents an input voltage range of −10.0000 to +10.0000 volts. Because the sensors of the illustrated embodiment output half this voltage range, representing half this distance, the usable display range is −0.7875" (−20,00 mm) to +0.7875" (+20,00 mm).

Due to the highly sensitive nature of the sensors preferably used in this tool, their outputs can be relatively noisy, having electrical glitches and "shot" noise superimposed on their output signals. This is preferably carefully filtered out by a filter circuit 2120 which couples the signal line of the cable 414 from the laser sensors to an analog input multiplexer 2130. An isolation amplifier 2135 isolates the multiplexer output from the converter input. In addition, the outputs of the laser heads are referenced to an analog ground point AR which is coupled to ground point 2140 inside the sensors' amplifiers 2150 by a power return line 2152 which has an effective line wiring resistance as represented by resistance 2154. For this reason, the outputs also carry a common mode voltage offset voltage component in addition to everything else.

As shown in the filter circuit 2120, the alignment tool system interface controller 412 is specially designed to filter the incoming signals relative to their internal ground points including the cable shielding 2160, while also filtering the ground point voltages. These are sensed and digitized separately and compared to determine the true signal voltage outputs from the sensors.

Despite all the analog filtering, local environment RFI (radio frequency interference), low frequency AC fields, and magnetic fields can still affect readings. To reduce or eliminate the effects of these environmental factors, the sensors are preferably sampled many times and the results are averaged to obtain the readings that are finally displayed. An options switch on the bottom of the PC board in the interface controller 412 can control how many readings are averaged.

Once filtered, converted, sampled, and averaged, the readings are displayed on the local LCD screen 530 and are also broadcast on the serial port to the computer 416.

Information transmitted on the serial port is updated once per second typically. In addition, the driver software for the serial port emits a synchronization signal and senses for a similar signal from a remote connection. The transmitted signal is used to indicate to the alignment tool system that an interface controller 412 is connected and active. When a similar signal is received from the alignment tool system 400 or 1400 (or other host), the interface controller 412 switches from local to remote mode. In this mode, the LCD display is not updated periodically. Instead, it serves as a data terminal display for the alignment tool system, allowing messages to be sent and shown.

Other than during the warm-up period, the front panel buttons are preferably continuously scanned. Activation of any of these buttons causes a message to be sent over the serial port. The inch/metric switch condition is preferably not transmitted to the computer 416 of the alignment tool system, as it contains its own option selector for this condition.

The interface controller 412 is a metal clamshell structure with the majority of the electronics attached to its front face cover. The laser sensor amplifiers are mounted to its base. Multicolor silk-screening and grouped connectors help to prevent connection errors. The extender cords for the laser measurement heads are also color coded. The interface controller 412 accommodates five laser sensors, although three are shown installed in the illustrated embodiment. More or fewer sensors may be provided depending upon the applications. These sensors are color coded and correspond directly to the red, blue and yellow color-coded laser sensor heads on the metrology tool.

An optional 4 line by 40 character high contrast LCD display with back light may be provided. Indicator LEDs for the slide switch-selectable English/Metric mode display and for prompting the operator during procedures are available on the front face. An RS-232 serial port enables connection and communication to the alignment tool system computer 416. This connection provides ASCII (human readable) data in a 9600,N,8,1 format. Connections to standard DB-9M PC COM ports (IBM-AT standard) are accomplished using a 9 wire male-female pass through cable. A null modem adapter or cable is preferably not to be used for normal connection to standard PC ports. Front panel pushbuttons include Zero, Back, Select, and Next functions. When communications are established with a host computer and the alignment tool system, the functions of these buttons are echoed in the alignment tool system 400 or 1400. The corded "universal" switching power supply accepts 90–265 VAC inputs from 45–75 hertz. The power supply accepts world standard IEC320 style line cords which allow the operator to plug in whatever local style is appropriate. Alternatively the interface controller 412 will accept "clean" 24+/−4 VDC from any convenient source. The center pin of the rear-panel-mounted power jack is positive. The power input is reverse polarity protected and fused. The power to the laser heads is preferably not provided to all of the heads at one time at start up. Instead, it is preferred that the heads be switched on in sequence, one at a time to facilitate proper operation.

A single 16-bit analog-to-digital converter is utilized for conversions from the laser head outputs to numeric information. This promotes uniformity and stability. The laser head signal inputs are heavily electrically filtered to enhance rejection of electrical and RF noise, as well as to reduce the effects of "shot noise" in their signals. The analog multiplexing circuitry is buffered to minimize variations from channel-to-channel. Multiplexer-induced variations are typically less than 0.002% of the final readings, therefore they are negligible. Samples of the laser head outputs are taken 160 times per second, but 128 or 256 readings are averaged to obtain each update value. This provides improved immunity to false readings caused by AC line pickup and line noise. The signals are taken from the laser heads in "Kelvin" style. That is to say that the ground reference is taken from a separate connection that is referenced internally to the laser heads. The true signals are differential voltages from this reference point. This technique reduces or eliminates "ground loop" (common mode) voltage effects. The options switch on the printed circuit board allows the operator to select the displayed resolution for English (inch) measurements. If set to "off", inch measurements are shown on the box's display as four decimal place numbers. If "on" they are displayed as three decimal place numbers. The switch setting has no effect upon metric (mm) displays, but has one other effect. When "off", 256 measurement samples are averaged to obtain each display update. When "on", 128 measurement samples are averaged. This affects the display update and reporting speed, but provides significantly greater stability for four decimal place displays.

The dimensions, ranges, shapes, materials, sizes, characteristics, finishes, processes and values of the interface controller construction and circuitry are provided as examples and can vary, depending upon the intended application.

Figure 23A:
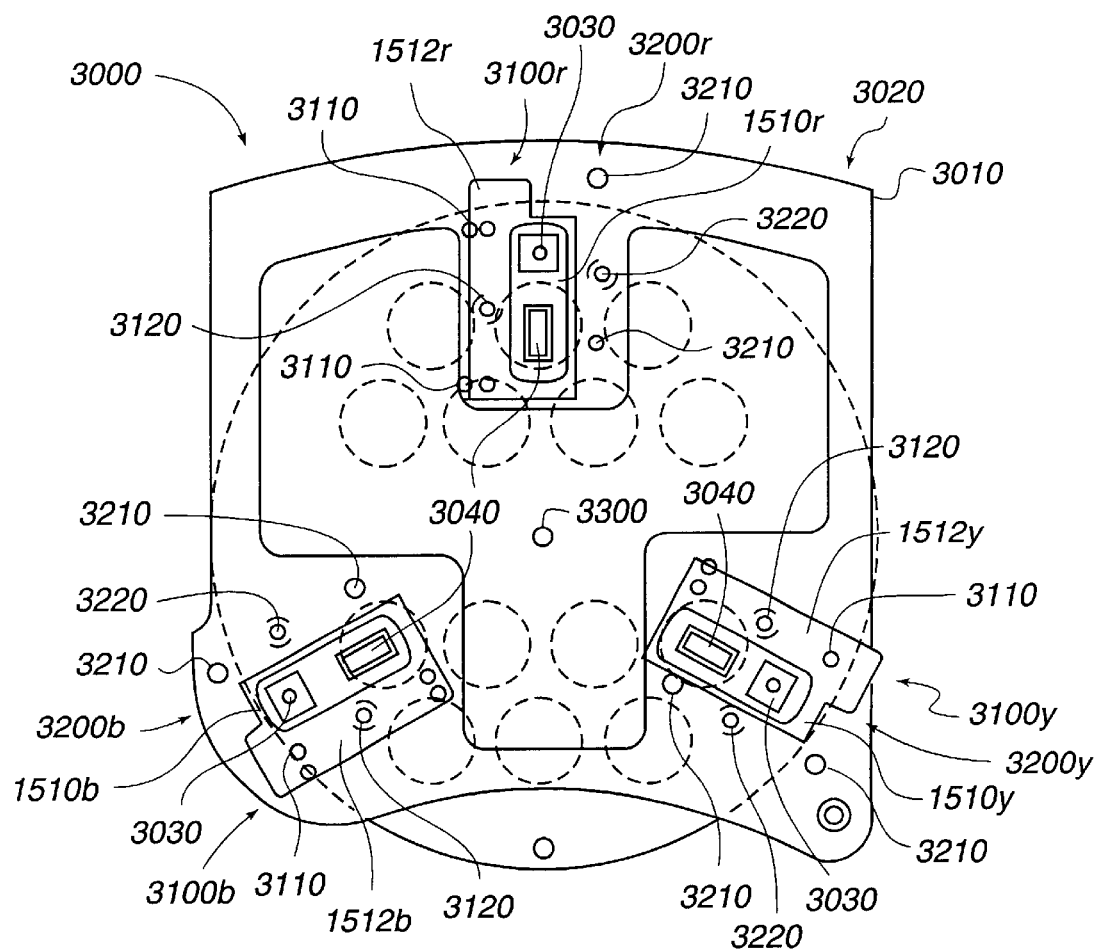
FIG. 23a is a top view of an alternative embodiment depicting the distance sensors in a first position.
Figure 23B:
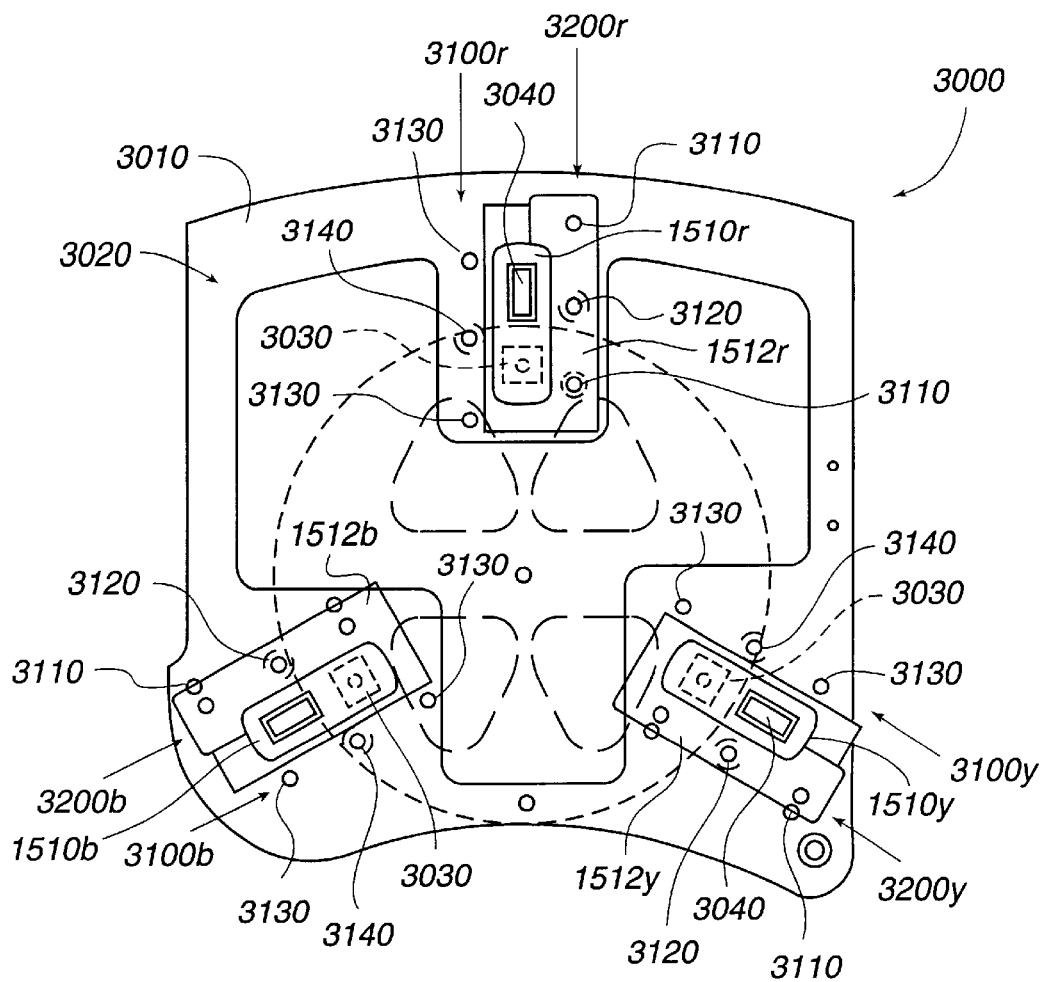
FIG. 23b is a top view of the tool of FIG. 23a depicting the distance sensors in a second position.
Figure 24A:
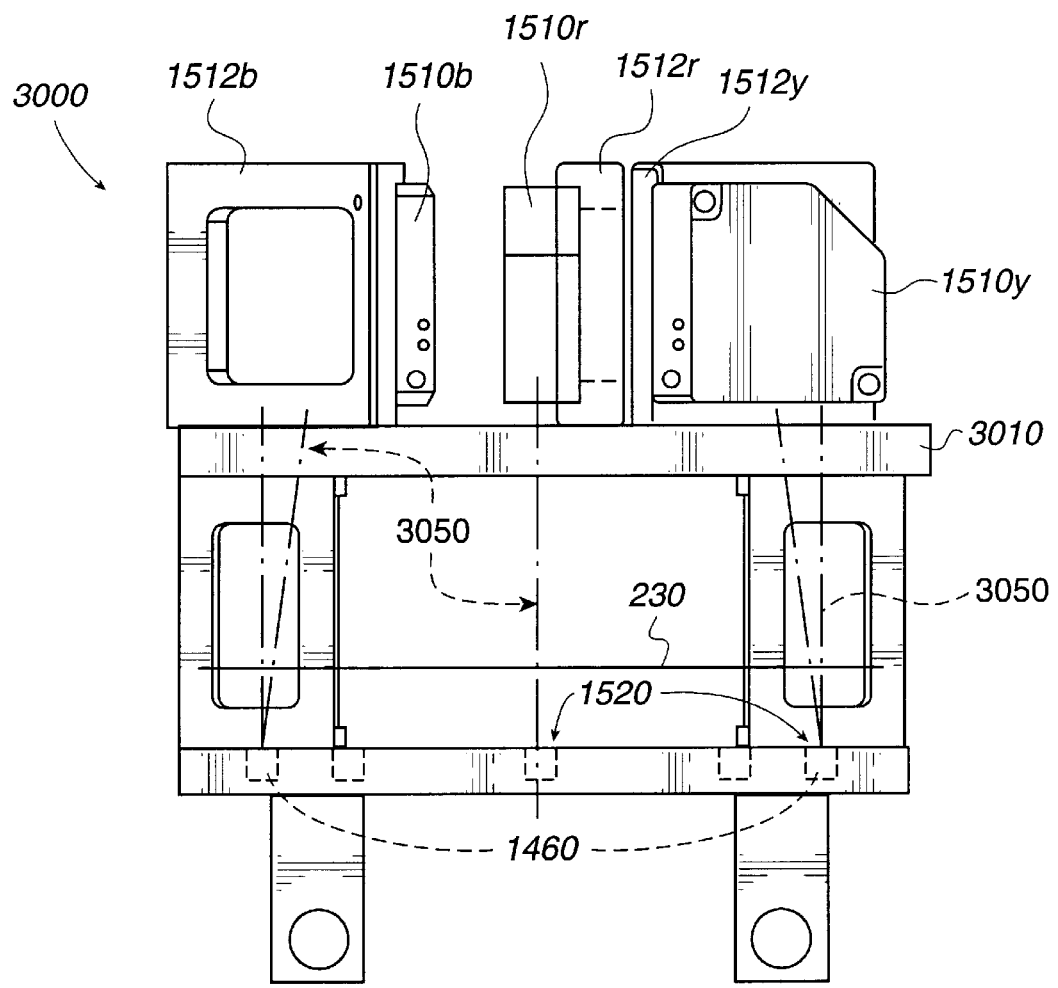
FIG. 24a is a side view of the tool of FIG. 23a depicting the distance sensors in the first position.
Figure 24B:
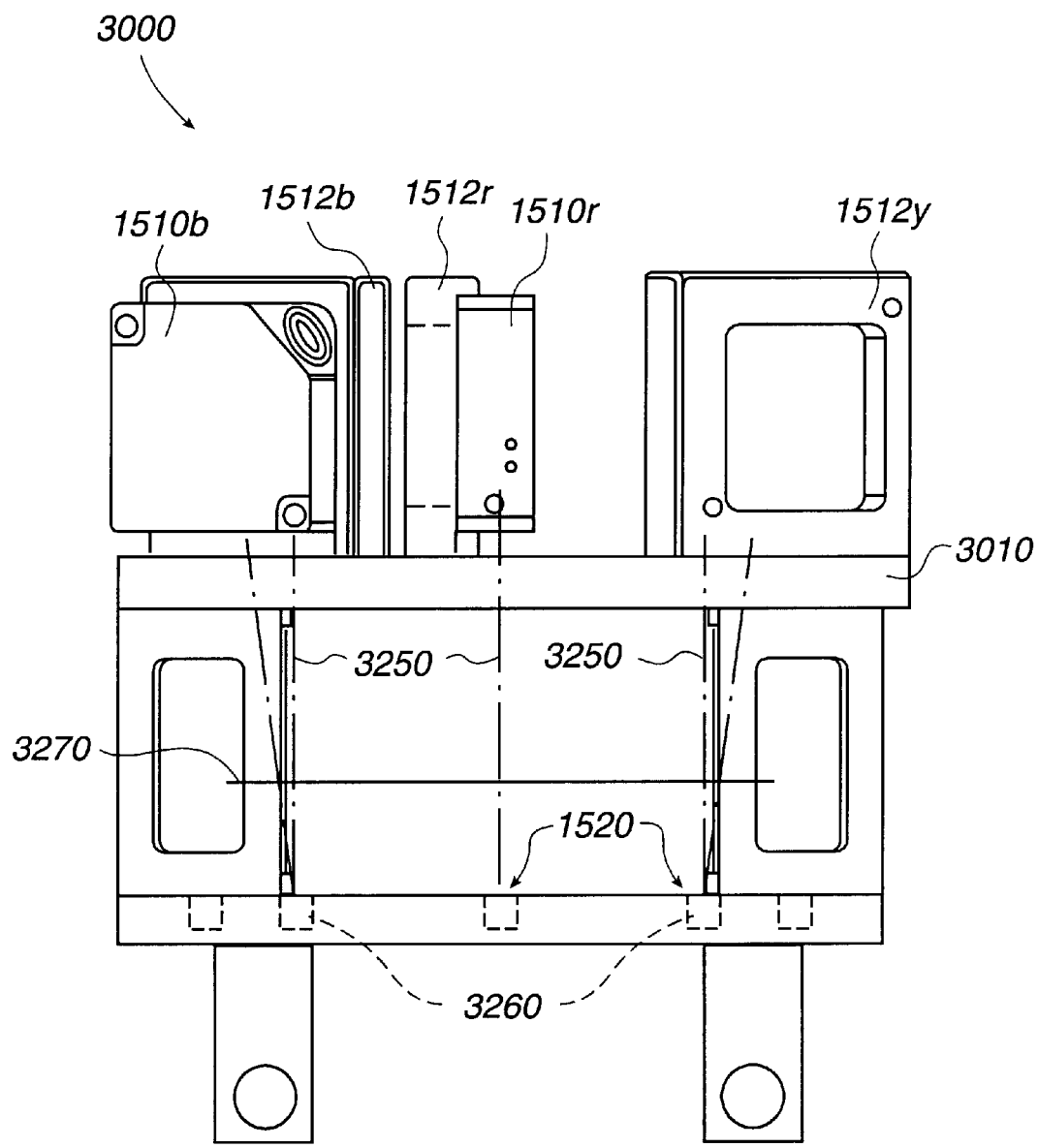
FIG. 24b is a side view of the tool of FIG. 23b depicting the distance sensors in the second position.

FIGS. 23a and 23b show a metrology tool 3000 in accordance with an alternative embodiment which is similar to the tool 1410 of FIGS. 17 and 18. The tool 3000 is readily adapted to be reconfigured to perform alignment procedures for wafers or other workpieces of different sizes. For example, FIGS. 23a and 24a show the tool 3000 configured to measure the orientation of a 200 mm wafer 230 in the same manner as the tool 1410 of FIGS. 17 and 18. In this configuration, each of the sensor mountings 1512r, 1512b and 1512y are fastened to a top plate 3010 of the tool frame 3020 so that each of the laser heads 1510r, 1510b and 1510y is positioned over an opening in the top plate 3010 to detect the orientation of the 200 mm wafer 230 below. However, as explained in greater detail below, the sensor mountings and associated laser heads may be readily reconfigured to measure the orientation of a smaller target such as a 150 mm target wafer as shown in FIGS. 23b and 24b. Although the examples of the illustrated embodiments are described in connection with 200 mm and 150 mm wafers, it is anticipated that the tools may be used in connection with robots for smaller or larger sized wafers or other workpieces, including 300 mm wafers, by appropriate scaling and other modifications, depending upon the application.

Each laser head includes a laser beam source 3030 and a light receptor or detector 3040. As shown in the configuration of FIGS. 23a and 24a, the sensor mountings position the light beam 3050 from each sensor source to be reflected back to the sensor detector by one of the three reference subsurfaces of the three buttons 1460, which define the reference plane 1520. A target such as a 200 mm silicon or ceramic target wafer 230 when inserted into the tool 3000, intercepts the three beams 3050 and reflects the beams to the detector of each laser head so that the orientation of the wafer 230 may be measured relative to the reference plane 1520 and the base plane of the platform.

In accordance with another aspect of the illustrated embodiments, the tool 3000 may be removed from the platform of one wafer handling system for wafers of one size such as 200 mm for example, and readily reconfigured to be placed on the platform of a second wafer handling system for wafers of a different size such as 150 mm, for example, to align the robot blade in the second handling system. As shown in FIG. 23a, laser head mountings 1512r, 1512b and 1512y are fastened to the plate 3010 using fasteners at three fastener positions indicated at 3100r, 3100b and 3100y, respectively. Each fastener position accommodates a pair of dowels 3110 and a screw 3120 which are received in corresponding dowel and screw holes or openings in an associated laser head mounting and in the plate 3010. For example, the dowel and screw holes 3130 and 3140 formed in the plate 3010 for each of the fastener positions 3100r, 3100b and 3100y are best seen in FIG. 24a in which the mountings have been removed from those fastener positions.

To facilitate reconfiguring the tool 3000 to perform alignment procedures for a different size wafer or other workpiece, the plate 3010 has another set of three fastener positions 3200r, 3200b and 3200y for the laser head mountings 1512r, 1512b and 1512y, respectively. Each fastener position includes a subset of dowel and screw openings, for example, a pair of dowel openings 3210 and a screw hole 3220 as shown in FIG. 23a. To reconfigure the tool 3000, the mountings 1512r, 1512b and 1512y may be unfastened from each of the three fastener positions 3100r, 3100b and 3100y, reversed in orientation and refastened to the associated fastener position of the second set of fastener positions 3200r, 3200b and 3200y for the laser head mountings 1512r, 1512b and 1512y, respectively, as shown in FIGS. 23b and 24b. Each laser head mounting 1512r, 1512b and 1512y may be fastened at the associated fastener position 3200r, 3200b and 3200y using two dowels 3110 and a screw fastener 3120 in the same manner as the configuration of FIG. 23a.

In this reversed orientation, the positions of the laser source 3030 and the laser detector 3040 are reversed in each laser head as compared to the orientation of the laser source 3030 and the laser detector 3040 in each laser head in the configuration of FIGS. 23a and 24a. As a consequence, the laser source in each laser head is positioned closer to the center of the tool and therefore may accommodate smaller targets such as a 150 mm target wafer.

As shown in the configuration of FIGS. 23b and 24b, the sensor mountings position the light beam 3250 from each sensor source to be reflected back to the sensor detector by one of a second set of three reference subsurfaces of the three buttons 3260, which define the reference plane 1520. A target such as a 150 mm silicon or ceramic target wafer 3270 when inserted into the tool 3000, intercepts the three beams 3250 and reflects the beams to the detector of each laser head so that the orientation of the wafer 3270 may be measured relative to the reference plane 1520 and the base plane of the platform for the robot having a 150 mm robot blade.

In the example described above, the distance sensor mountings are selectively fastened to the frame in either a first set of positions 3100r, 3100b, 3100y or a second set of positions 3200r, 3200b, 3200y. When the distance sensors are mounted in the first position (FIG. 23a), the laser emitters 3030 form an equilateral triangle in which each laser emitter at an apex of the triangle is spaced a first distance from the center axis 3300 which, in the illustrated embodiment, coincides with the center of the wafer when positioned in the tool for measurement. In this position, the light receptors 3040 which also form an equilateral triangle, are each positioned closer to the frame axis 3300 than the laser emitter 3030 of each sensor.

Conversely, when the distance sensors are mounted in the second position shown in FIG. 23b, the sensors are reversed so that the laser emitters 3200r, 3200b and 3200y form a second equilateral triangle in which each laser emitter at an apex of the triangle is spaced a second, closer distance from the center axis 3300. In this position, the light receptors 3040, which again form an equilateral triangle, are each positioned farther from the frame axis 3300 than is the laser emitter 3030 of each sensor.

It is anticipated that a shift in the positions of the distance sensors of a metrology tool such as the metrology tool 3000 may be achieved in a variety of techniques. For example, rather than reversing the orientation of the sensors, a shift in position may be achieved by shifting the positions of the sensors without changing the orientation of the sensors. In addition, rather than arranging the sensors symmetrically in an equilateral triangle about a central axis, the sensors may be arranged in a variety of other configurations, both symmetrical and nonsymmetrical.

Each mounting position such as mounting position 3200r includes a subset of fastener surfaces which, in the illustrated embodiment, include the dowel holes 3110 and the screw hole 3120. These apertures receive a corresponding elongated member such as a dowel 3110 or a screw 3120. It is anticipated that other techniques and fastener means may be used instead of dowels, dowel holes, screws and screw holes to selectively fasten the sensor mountings in a plurality of positions so that the tool may align robots for different sized wafers and other workpieces. For example, other types of removable fasteners may be used including clamps or non-threaded elongated members and corresponding apertures such as key members and key slots.

The dowel and screw openings 3210, 3220 in the plate 3010 and in each mounting are spaced in a unique fashion for each mounting position 3100r, 3100b, 3100y so as to inhibit undesired switching of the laser heads between the three positions indicated in FIG. 23a. Similarly, the dowel and screw openings 3210, 3220 in the plate 3010 are spaced in a unique fashion for each mounting position 3200r, 3200b, 3200y so as to inhibit undesired switching of the laser heads between the three positions indicated in FIG. 23b. Other embodiments may omit such unique spacing.

In the illustrated embodiments, the reference surface buttons 1460 of FIG. 24a are arranged symmetrically in an equilateral triangle about the center axis 3300 to correspond with the positioning of the sensors in the first position of FIG. 23a. Similarly, the reference surface buttons 3260 of FIG. 24b are arranged symmetrically in an equilateral triangle about the center axis 3300 to correspond with the positioning of the sensors in the second position of FIG. 23b. Rather than arranging the reference surface buttons symmetrically in an equilateral triangle about a central axis, the buttons may be arranged in a variety of other configurations, both symmetrical and nonsymmetrical to correspond with the positions of the sensors. In addition, are rather than providing individual, coplanar reference subsurfaces for each sensor position, subsurfaces may be combined into larger surfaces to define an appropriate reference plane or planes. In addition, a reference surface may be omitted altogether in some applications.

It will, of course, be understood that modifications of the illustrated embodiments, in their various aspects, will be apparent to those skilled in the art, some being apparent only after study, others being matters of routine mechanical and electronic design. Other embodiments are also possible, their specific designs depending upon the particular application. For example, a variety of methods and devices for physical measurements may be utilized in addition to those described above. Such methods and devices may include, for example, inductive and capacitive proximity sensors, non-laser optical sensors, sonic distance sensors and others. A variety of workpiece and robot blade shapes and sizes may also be utilized. Furthermore, a variety of graphical displays visually depicting alignments and misalignments and the degrees of such may be used in addition to or instead of numerical displays. As such, the scope of the invention should not be limited by the particular embodiments described herein but should be defined by the appended claims and equivalents thereof.

What is claimed is:

1. An alignment tool for aligning a robot blade carrying a workpiece in a workpiece handling system, and a base plane defined by a platform of said system, comprising:
   a frame having a base adapted to be supported by said platform of said system, said frame further having a plurality of sensor mountings; and
   a plurality of non-contact distance sensors mounted to said sensor mountings;
   wherein said frame defines an opening positioned between said base and said sensors, said opening being sized sufficiently to admit a target carried by said robot blade between said sensors and said base and wherein said sensors are positioned by said sensor mountings to measure the orientation of said target carried by said robot blade relative to said base plane.

2. The alignment tool of claim 1 wherein said system includes a chamber having a floor and a robot carrying said robot blade, and wherein said platform includes said floor of said chamber and said floor defines said base plane.

3. The alignment tool of claim 2 wherein said base includes a plurality of legs adapted to engage said floor.

4. The alignment tool of claim 3 wherein said base includes a base plate carried by said plurality of legs, said frame further including a top plate carrying said sensor mountings, and a plurality of brackets spacing said top plate above said base plate.

5. The alignment tool of claim 1 wherein said target defines a plane and said plurality of non-contact distance sensors includes three sensors, each sensor being positioned to measure the distance between that sensor and a separate location on said target plane to determine the spatial orientation of said target plane relative to said base plane.

6. The alignment tool of claim 5 wherein each sensor includes an optical sensor.

7. The alignment tool of claim 6 wherein each sensor includes a laser adapted to emit a laser beam onto said target.

8. An alignment tool for aligning a robot blade carrying a workpiece in a workpiece handling system, and a base plane defined by a platform of said system, said platform having a support surface, comprising:
   a frame adapted to be supported by said platform support surface, said frame having a reference surface and a first support surface positioned to engage said platform support surface and to support said reference surface a first predetermined distance from said platform support surface; and
   a first distance sensor positioned to measure the distance of said reference surface from said sensor and to measure the distance of a target from said sensor, wherein said target is adapted to be carried by said robot blade.

9. The alignment tool of claim 8 wherein said distance sensor is carried within said frame.

10. The alignment tool of claim 8 wherein said distance sensor includes a laser head.

11. The alignment tool of claim 8 wherein said first distance sensor is positioned to measure the distance of a first location of said reference surface from said sensor and to measure the distance of a first location of said target from said sensor, said tool further comprising a second distance sensor positioned to measure the distance of a second location of said reference surface from said second sensor and to measure the distance of a second location of said target from said second sensor.

12. The alignment tool of claim 11 wherein said system has a mechanism for adjusting the orientation of said robot blade along a first direction, wherein said first and second sensors are disposed along a line parallel to said first direction.

13. The alignment tool of claim 12 further comprising a third distance sensor positioned to measure the distance of a third location of said reference surface from said third sensor and to measure the distance of a third location of said target from said third sensor.

14. The alignment tool of claim 13 wherein said system has a mechanism for adjusting the orientation of said robot blade along a second direction, wherein said second and third sensors are disposed along a line parallel to said second direction.

15. An alignment tool for aligning a robot blade carrying a workpiece in a robot chamber of a workpiece handling system, and a base plane defined by a floor surface of said chamber of said system, comprising:
   a frame adapted to be supported by said floor surface, said frame having a plurality of legs adapted to engage said floor surface to support said frame above said floor surface; and
   a distance sensor attached to said frame and positioned to measure the distance of a target carried by said robot blade in said chamber, from said sensor.

16. An alignment tool for aligning a robot blade carrying a workpiece in a chamber of a workpiece handling system, and a base plane defined by a support surface of said system, comprising:
   a frame adapted to be supported by said system support surface; and
   a plurality of non-contact distance sensors positioned within said frame to measure the tilt orientation of a target carried by said robot blade relative to a reference plane within said frame.

17. An alignment tool for aligning a robot blade carrying a workpiece in a chamber of a workpiece handling system, and a base plane defined by a support surface of said system, comprising:
   a frame adapted to be supported by said system support surface; and
   a plurality of non-contact distance sensors positioned within said frame to measure the orientation of a target carried by said robot blade relative to a reference plane within said frame wherein said system has a chamber which has a floor which defines a base plane and said frame has a reference surface which defines said reference plane at a predetermined height above said base plane.

18. The tool of claim 17 wherein said reference plane is substantially parallel to said base plane.

19. The tool of claim 18 wherein said reference surface includes three separate and coplanar subsurfaces.

20. The tool of claim 16 wherein said plurality of distance sensors are positioned to measure the distances of a plurality of locations on a target carried by said robot blade relative to said reference plane.

21. The tool of claim 20 wherein each of said sensors comprises a laser distance sensor carried by said frame and positioned to measure one of said distances of said plurality of locations on said target carried by said robot blade relative to said reference plane.

22. The tool of claim 20 further comprising a display for displaying a numerical representation of each of said measured distances of said plurality of locations on said target carried by said robot blade relative to said reference plane.

23. The tool of claim 16 further comprising a display for displaying at least one of a numerical representation and a graphical representation of said measured orientation of said reference plane relative to said target carried by said robot blade.

24. The tool of claim 20 further comprising a calculator for calculating a difference between selected measured distances of selected locations of said plurality of locations on said target carried by said robot blade relative to said reference plane.

25. The tool of claim 24 further comprising a display for displaying a numerical representation of said calculated difference between selected measured distances of selected locations of said plurality of locations on said target carried by said robot blade relative to said reference plane.

26. An alignment tool for aligning a robot blade carrying a workpiece in a workpiece handling system, with respect to a base plane defined by a platform of said system, comprising:
means for measuring the orientation of a target carried by said robot blade relative to said base plane, said measuring means including a plurality of distance sensor means for measuring the distances between said target and each of said sensor means, and frame means having a base, for mounting said sensor means and supporting said sensor means above said platform of said system, said frame means having opening means for admitting a target carried by said robot blade between said sensor means and said base.

27. The alignment tool of claim 25 wherein said system platform includes a chamber having a floor and wherein said frame means base has means for positioning said base on said floor of said chamber.

28. The alignment tool of claim 22 wherein said base plane is defined by said chamber floor.

29. The alignment tool of claim 27 wherein said base positioning means includes a plurality of legs adapted to rest on said floor.

30. The alignment tool of claim 26 herein said frame means includes reference surface means for providing a reference plane parallel to and a predetermined distance above said base plane; and said measuring means includes means for measuring the orientation of said target carried by said robot blade relative to said reference plane.

31. The alignment tool of claim 26 herein said sensor means includes laser means for emitting a laser beam and detector means for detecting a laser beam.

32. The alignment tool of claim 30 wherein a first sensor means includes means for measuring the distance of a first location of said reference surface from said first sensor means and measuring the distance of a first location of said target from said first sensor means; a second sensor means includes means for measuring the distance of a second location of said reference surface from said second sensor means and measuring the distance of a second location of said target from said second sensor means; and a third sensor means includes means for measuring the distance of a third location of said reference surface from said third sensor means and measuring the distance of a third location of said target from said third sensor means.

33. The alignment tool of claim 32 further comprising display means for displaying a numerical representation of each of said measured distances of said plurality of locations on said target carried by said robot blade relative to said reference surface.

34. The alignment tool of claim 26 further comprising display means for displaying at least one of a numerical representation and a graphical representation of said measured orientation of said target carried by said robot blade relative to said base plane.

35. The alignment tool of claim 32 further comprising calculating means for calculating a difference between selected measured distances of selected locations of said plurality of locations on said target carried by aid robot blade relative to said reference surface.

36. The alignment tool of claim 35 further comprising display means for displaying a numerical representation of said calculated difference between selected measured distances of selected locations of said plurality of locations on said target carried by said robot blade relative to said reference surface.

37. An alignment tool for aligning a robot blade carrying a target wafer in a transfer chamber, and a base plane defined by a floor of said transfer chamber, comprising:
a frame having a plurality of legs adapted to be supported by said floor of said transfer chamber, said frame further having a first plate which defines at least three triangularly spaced, coplanar reference surfaces, said frame further having at least three triangularly spaced sensor mountings, a second plate carrying said sensor mountings, and a plurality of brackets spacing said first plate and said second plate; and
at least three laser distance measuring sensors, each sensor being mounted to a sensor mounting and positioned facing a reference surface on said first plate;
wherein said frame defines an opening positioned between said reference surfaces and said sensors, said opening being sized sufficiently to admit a target wafer carried by said robot blade between said sensors and said reference surfaces and wherein said sensors are positioned by said sensor mountings to measure the orientation of said target wafer carried by said robot blade relative to said coplanar reference surfaces.

* * * * *